United States Patent
Tsai et al.

(10) Patent No.: US 10,430,634 B2
(45) Date of Patent: Oct. 1, 2019

(54) BIOMETRIC SENSING DEVICE AND DISPLAY DEVICE

(71) Applicant: InnoLux Corporation, Miao-Li County (TW)

(72) Inventors: Chia-Hao Tsai, Miao-Li County (TW); Ming-Jou Tai, Miao-Li County (TW); Yi-Shiuan Cherng, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 184 days.

(21) Appl. No.: 15/715,176

(22) Filed: Sep. 26, 2017

(65) Prior Publication Data

US 2018/0101712 A1 Apr. 12, 2018

(30) Foreign Application Priority Data

Oct. 11, 2016 (CN) .......................... 2016 1 0886324
May 19, 2017 (CN) .......................... 2017 1 0359120

(51) Int. Cl.
| | |
|---|---|
| G06K 9/00 | (2006.01) |
| H01L 27/32 | (2006.01) |
| H01L 27/15 | (2006.01) |
| G06F 3/044 | (2006.01) |
| G06F 3/041 | (2006.01) |
| G06F 3/042 | (2006.01) |

(Continued)

(52) U.S. Cl.
CPC ........... *G06K 9/0002* (2013.01); *G06F 3/044* (2013.01); *G06F 3/0412* (2013.01); *G06F 3/0416* (2013.01); *G06F 3/0421* (2013.01); *H01L 27/156* (2013.01); *H01L 27/323* (2013.01); *H01L 27/3225* (2013.01); *H01L 27/3251* (2013.01); *H01L 27/3262* (2013.01); *H01L 27/3272* (2013.01); *G02F 1/1368* (2013.01); *G02F 1/136209* (2013.01); *G06F 2203/04106* (2013.01); *G06F 2203/04107* (2013.01); *G06F 2203/04111* (2013.01); *H01L 27/1251* (2013.01)

(58) Field of Classification Search
CPC .................................................... G06K 9/0002
See application file for complete search history.

(56) References Cited

U.S. PATENT DOCUMENTS 9,152,841 B1 * 10/2015 Riedijk ................ G06K 9/0002
9,927,907 B2 * 3/2018 Giacomini ............. H03K 17/96
(Continued)

*Primary Examiner* — Utpal D Shah
(74) *Attorney, Agent, or Firm* — Winston Hsu

(57) ABSTRACT

A biometric sensing device includes a first electricity storage component, a first sensing component, a first driving component and a control unit. The first sensing component is coupled with the first electricity storage component, wherein when the first sensing component is turned on, a charging path is formed between the first sensing component and the first electricity storage component, and the first sensing component makes the first electricity storage component be charged according to a sensed biometric. The first driving component is coupled with the first electricity storage component and the first sensing component, wherein when the first driving component is turned on, the first electricity storage component discharges. The control unit is coupled with the first sensing component and/or the first driving component for turning on the first sensing component and the first driving component.

20 Claims, 17 Drawing Sheets

(51) Int. Cl.
  *H01L 27/12* (2006.01)
  *G02F 1/1362* (2006.01)
  *G02F 1/1368* (2006.01)

(56) References Cited

U.S. PATENT DOCUMENTS

| | | | | |
|---|---|---|---|---|
| 2004/0080882 | A1* | 4/2004 | Miyazawa | G06K 9/0002 361/56 |
| 2005/0024065 | A1* | 2/2005 | Umeda | G01D 5/2417 324/663 |
| 2011/0064943 | A1* | 3/2011 | Wang | H01B 1/04 428/332 |
| 2013/0044074 | A1* | 2/2013 | Park | G02F 1/13338 345/174 |
| 2014/0225838 | A1* | 8/2014 | Gupta | G06F 3/0412 345/173 |
| 2015/0090477 | A1* | 4/2015 | Yang | H05K 3/28 174/250 |
| 2015/0253917 | A1* | 9/2015 | Fan | G06F 3/044 345/173 |
| 2015/0254491 | A1* | 9/2015 | Mo | G06F 3/0416 345/174 |
| 2016/0328592 | A1* | 11/2016 | Li | G06K 9/0002 |
| 2017/0003777 | A1* | 1/2017 | Akhavan Fomani | G06F 3/044 |
| 2017/0270333 | A1* | 9/2017 | Jeon | G06K 9/001 |
| 2017/0286747 | A1* | 10/2017 | Kim | G06K 9/00087 |
| 2019/0050623 | A1* | 2/2019 | Lavin | G06K 9/0002 |

\* cited by examiner

BIOMETRIC SENSING DEVICE AND DISPLAY DEVICE

BACKGROUND OF THE DISCLOSURE

1. Field of the Disclosure

The present disclosure relates to a biometric sensing device and a display device, and more particularly to a biometric sensing device and a display device for improving intensity of biometric sensing signals.

2. Description of the Prior Art

Generally, biometric recognition can be utilized for identity identification, and therefore, with the development of electronic devices, the function of the biometric recognition is also integrated in various electronic devices and widely used. Taking a display device such as smart phone as an example, the user can control the electronic device directly through the biometric recognition while to memorize the password is not needed. In addition, because the process of the biometric recognition is fast and difficult to be imitated, the biometric recognition can provide good convenience or safety.

In the conventional technique, a biometric recognition device is usually disposed out of the display device and is separate from the display device. In another aspect, the sizes of sensing electrodes of a conventional touch sensing display device are generally about 5 mm. Accordingly, if the conventional biometric recognition device is integrated into the touch sensing display device, the sensing signals would be too slight or the coupling intensity would not be enough due to the greater sizes of the sensing electrodes with respect to the small sizes of the biometric features, or due to the farther coupling distance between the finger and the sensing electrodes. As a result, the recognition accuracy of the conventional biometric recognition device integrated in the touch sensing display device is limited.

SUMMARY OF THE DISCLOSURE

According to an embodiment, the present disclosure provides a biometric sensing device including a first electricity storage component, a first sensing component, a first driving component and a control unit. The first sensing component is coupled with the first electricity storage component, wherein when the first sensing component is turned on, a charging path is formed between the first sensing component and the first electricity storage component, and the first sensing component makes the first electricity storage component be charged according to a sensed biometric. The first driving component is coupled with the first electricity storage component and the first sensing component, wherein when the first driving component is turned on, the first electricity storage component discharges. The control unit is coupled with the first sensing component and the first driving component for turning on the first sensing component and the first driving component.

According to another embodiment, the present disclosure provides a display device including a first substrate, a second substrate, a plurality of pixel transistors, a biometric sensing device and a plurality of display components. The first substrate includes a biometric recognition area. The second substrate is disposed opposite to the first substrate. The pixel transistors are disposed on the first substrate. The biometric sensing device is disposed on the first substrate and includes a plurality of electricity storage components, a plurality of sensing components, a plurality of driving components and a control unit. The electricity storage components are disposed on the biometric recognition area. The sensing components are disposed on the biometric recognition area and respectively coupled with the electricity storage components. The driving components are disposed on the biometric recognition area and respectively coupled with the electricity storage components and the sensing components. The control unit is coupled with the sensing components and/or the driving components through a plurality of signal lines. The display components are respectively disposed on the pixel transistors and respectively coupled with the pixel transistors.

These and other objectives of the present disclosure will no doubt become obvious to those of ordinary skill in the art after reading the following detailed description of the embodiment that is illustrated in the various figures and drawings.

DETAILED DESCRIPTION

Figure 1:
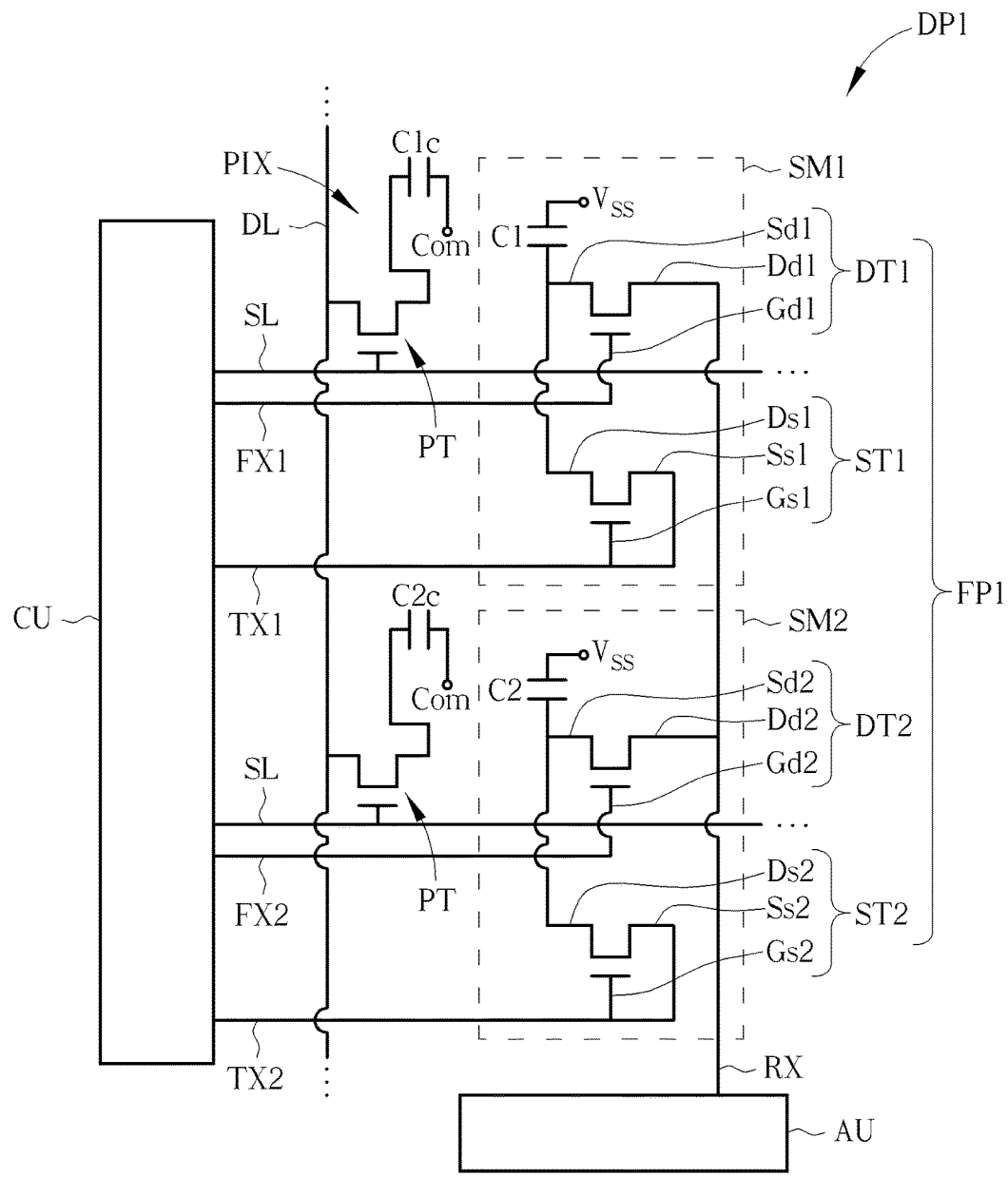
FIG. 1 is a schematic diagram of circuit architecture according to a first embodiment of a biometric sensing device of the present disclosure.

To provide a better understanding of the present disclosure to the skilled users in the technology of the present disclosure, embodiments will be detailed as follows. The embodiments of the present disclosure are illustrated in the accompanying drawings with numbered elements to elaborate on the contents and effects to be achieved. It is needed to note that the drawings are simplified schematic, and therefore, the drawings show only the components and combinations associated with the present disclosure, so as to provide a clearer description of the basic architecture or method of implementation of the present disclosure. The components would be complex in reality. In addition, in order to explain, the components shown in the drawings of the present disclosure are not drawn to the actual number, shape, and dimensions, and the detail can be adjusted according to the design requirements.

When the terms "include", "comprise" and/or "have" are used in the description of the present disclosure, it indicates that the existence of the corresponding features, areas/regions, steps, operations and/or components, without excluding the existence or addition of one or a plurality of other features, areas/regions, steps, operations and/or components. When the corresponding component such as layer or area/region is referred to "on another component (or the variant thereof)" or "extend to another component", it may be disposed directly on another component or directly extend to another component, or other component may exist therebetween. On the other hand, when the component is referred to be "directly on another component (or the variant thereof)" or "directly extend to another component", there is no other component existing therebetween. In addition, when the component is referred to "be coupled to/with another component (or the variant thereof)", it may be directly connected to another component, or may be indirectly connected (such as electrically connected) to another component through other component or components.

It should be noted that the technical features in different embodiments described in the following can be replaced, recombined, or mixed with one another to constitute another embodiment without departing from the spirit of the present disclosure.

Figure 2:
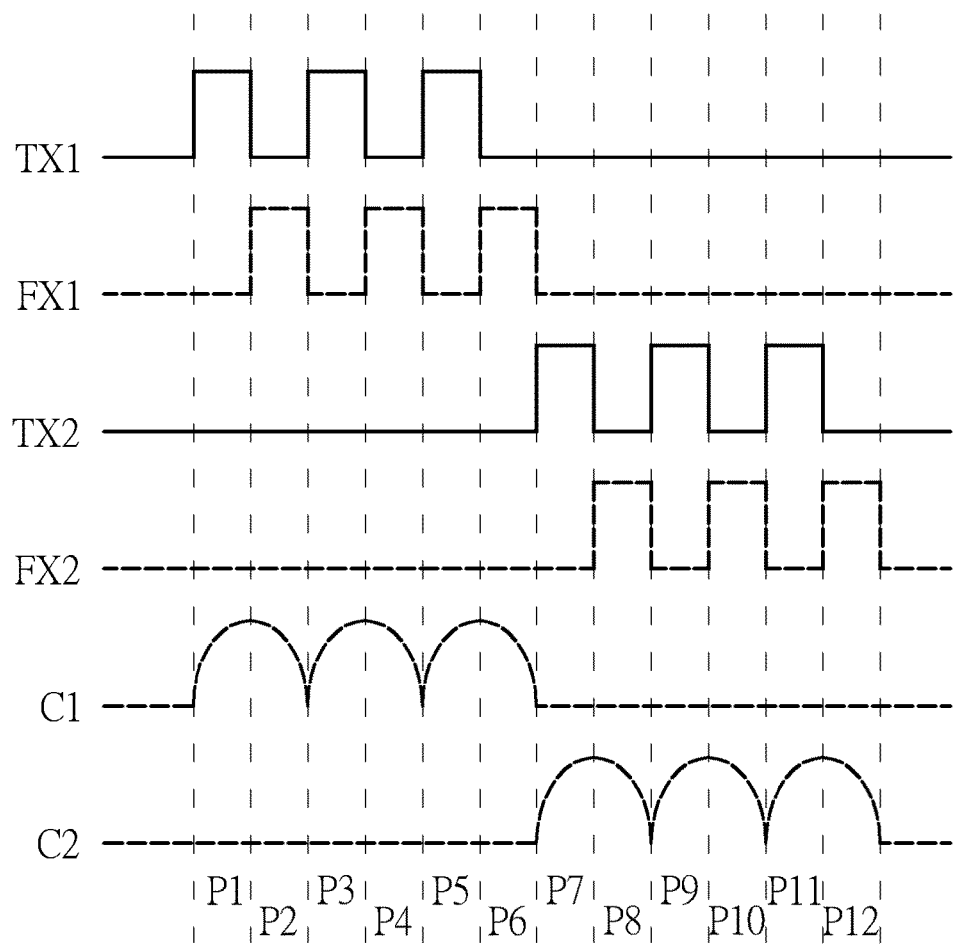
FIG. 2 is a schematic diagram of charging procedure of the electricity storage component and control signals according to the first embodiment of the biometric sensing device of the present disclosure.

Referring to FIG. 1 and FIG. 2, FIG. 1 is a schematic diagram of circuit architecture according to a first embodiment of a biometric sensing device of the present disclosure, and FIG. 2 is a schematic diagram of charging procedure of the electricity storage component and control signals according to the first embodiment of the biometric sensing device. The biometric sensing device of the present disclosure, as well as any display device incorporating the biometric sensing device of the present disclosure, could be used to detect the biometric characters, such as fingerprint, but not limited thereto. As shown in FIG. 1, the biometric sensing device FP1 of this embodiment includes a control unit CU and at least one sensing unit, and the biometric sensing device FP1 of this embodiment includes two sensing units as an example. In variant embodiments, the biometric sensing device FP1 may include one single sensing unit or three or more sensing units. As shown in FIG. 1, the biometric sensing device FP1 includes a first sensing unit SM1 and a second sensing unit SM2. The first sensing unit SM1 includes a first electricity storage component C1, a first sensing component ST1 and a first driving component DT1. The second sensing unit SM2 includes a second electricity storage component C2, a second sensing component ST2 and a second driving component DT2. In the first sensing unit SM1, the first electricity storage component C1 is utilized for being charged and storing electric charges and may be coupled with a voltage source Vss, the first sensing component ST1 is coupled with the first electricity storage component C1, and the first driving component DT1 is coupled with the first electricity storage component C1 and the first sensing component ST1. In this embodiment, the first electricity storage component C1 refers to an electronic component which can store the electric charges, such as a capacitor, the first sensing component ST1 may be an electronic component having a function of sensing the intensity of exposing light, such as an N-type thin film transistor, and the first driving component DT1 may be an electronic component having a switching function, such as an N-type thin film transistor, but the components suitable for the present disclosure are not limited to the above. In addition, the control unit CU is coupled with the first sensing component ST1 and the first driving component DT1 for being capable of turning on the first sensing component ST1 and the first driving component DT1 respectively. When the first sensing component ST1 is turned on, a charging path is formed between the first sensing component ST1 and the first electricity storage component C1, and the first sensing component ST1 makes the first electricity storage component C1 be charged and store the electric charges according to a sensed biometric. When the first driving component DT1 is turned on, the first driving component DT1 can release the electric charges stored in the first electricity storage component C1, that is, when the first driving component DT1 is turned on, the first electricity storage component C1 discharges. In another aspect, the second electricity storage component C2, the second sensing component ST2 and the second driving component DT2 of the second sensing unit SM2 have the functions, coupling relations with each other and with the control unit CU, and the driving relations similar to the first sensing unit SM1 mentioned-above, and will not be redundantly described. The sensing units of the biometric sensing device FP1 of this embodiment are disposed in a biometric recognition area, and the control unit CU may be disposed in an area outside the biometric recognition area, such as in the chip area or in the circuit area, but not limited thereto. In some embodiments, a partial of the components of the sensing units may be disposed outside the biometric recognition area. In still some embodiments, the control unit CU may be disposed in the biometric recognition area.

In detail, the first sensing component ST1 includes a gate Gs1, a source Ss1 and a drain Ds1, and the second sensing component ST2 includes a gate Gs2, a source Ss2 and a drain Ds2. In this embodiment, the gate Gs1 of the first sensing component ST1 and the gate Gs2 of the second sensing component ST2 are coupled with the control unit CU, such that the control unit CU may control the switching function of the first sensing component ST1 and the second sensing component ST2 through the gate Gs1 and Gs2. The source Ss1 of the first sensing component ST1 is coupled with the gate Gs1 of the first sensing component ST1, the source Ss2 of the second sensing component ST2 is coupled with the gate Gs2 of the second sensing component ST2, the drain Ds1 of the first sensing component ST1 is coupled with the first electricity storage component C1, and the drain Ds2 of the second sensing component ST2 is coupled with the second electricity storage component C2. In addition, the first driving component DT1 includes a control node, a first node and a second node, and because the first driving component DT1 of this embodiment is a thin film transistor as an example, the control node, the first node and the second node are a gate Gd1, a source Sd1 and a drain Dd1 of the first driving component DT1 respectively. As shown in FIG. 1, the gate Gd1 of the first driving component DT1 is coupled with the control unit CU, and therefore the control unit CU is capable of controlling the switching function of the first driving component DT1 through the gate Gd1, which means the control unit CU can turn on or turn off the first driving component DT1. The source Sd1 of the first driving component DT1 is coupled with the first electricity storage component C1 and the drain Ds1 of the first sensing component ST1. The drain Dd1 of the first driving component DT1 is coupled with a signal receiving line, so as to output the electric charges stored in the first electricity storage component C1, that is to say, the first electricity storage component C1 discharges through the drain Dd1 of the first driving component DT1. Similarly, the second driving component DT2 includes a gate Gd2 serving as a control node, a source Sd2 serving as a first node and a drain Dd2 serving as a second node, and the coupling arrangement of the second driving component DT2 with the control unit CU, the second electricity storage component C2 and the second sensing component ST2 is similar to the first driving component DT1 mentioned-above, and will not be redundantly described. Moreover, the biometric sensing device FP1 of this embodiment may further include one or more sensing control lines TX1, TX2, one or more driving control lines FX1, FX2 and one or more signal receiving lines RX. For example, the sensing control line TX1 is coupled with the gate Gs1 of the first sensing component ST1 and the control unit CU, and the sensing control line TX2 is coupled with the gate Gs2 of the second sensing component ST2 and the control unit CU, so as to respectively transmit control signals of the control unit CU to the first sensing component ST1 and the second sensing component ST2. The driving control line FX1 is coupled with the gate Gd1 of the first driving component DT1 and the control unit CU, and the driving control line FX2 is coupled with the gate Gd2 of the second driving component DT2 and the control unit CU, so as to respectively transmit control signals of the control unit CU to the first driving component DT1 and the second driving component DT2. The signal receiving line RX is coupled with the drain Dd1 of the first driving component DT1 and the drain Dd2 of the second driving component DT2, so as to release the electric charges stored in the first electricity storage component C1 or the second electricity storage component C2 to an arithmetic unit AU, and therefore, a profile of the biometric may be obtained or a biometric recognition may be performed.

As shown in FIG. 1 and FIG. 2, the control unit CU provides the control signals for the first sensing component ST1, the second sensing component ST2, the first driving component DT1 and the second driving component DT2 through the sensing control lines TX1, TX2 and the driving control lines FX1, FX2 respectively, so as to control the switching function of these components. Wherein, the control unit CU may control the first sensing unit SM1 and the second sensing unit SM2 in a plurality of successive periods, and the first sensing unit SM1 and the second sensing unit SM2 of this embodiment are operated in different periods to perform the biometric sensing procedure by turns. In detail, the control unit CU respectively makes the first sensing unit SM1 perform biometric sensing procedure and turns off the second sensing unit SM2 in the first period P1 and the second period P2. In the first period P1, the control unit CU may output high-voltage control signals (for example, 5 volts) to the gate Gs1 of the first sensing component ST1 for turning on the first sensing component ST1 through the sensing control line TX1, and may output low-voltage control signals (for example, 0 volt) to the gate Gd1 of the first driving component DT1 for turning off the first driving component DT1 through the driving control line FX1, such that the control unit CU, the first sensing component ST1 and the first electricity storage component C1 are conducted to form a charging path, and therefore the first electricity storage component C1 is charged. Next, in the second period P2, the control unit CU may output high-voltage control signals to the gate Gd1 of the first driving component DT1 for turning on the first driving component DT1 through the driving control line FX1, and the sensing control line TX1 may transmit low-voltage control signals to the gate Gs1 of the first sensing component ST1 for turning off the first sensing component ST1, so as to release the electric charges stored in the first electricity storage component C1 to the arithmetic unit AU. In other words, the first sensing component ST1 is turned on and makes the first electricity storage component C1 be charged in the first period P1, the first driving component DT1 is turned on and makes the first electricity storage component C1 discharge in the second period P2, and the control unit CU respectively provide different control signals for the first sensing component ST1 and the first driving component DT1 in the same period. In this embodiment, in the third period P3, the fourth period P4, the fifth period P5 and the sixth period P6, the control unit CU may make the first sensing unit SM1 repeatedly perform the biometric sensing procedure, the same as the biometric sensing procedure in the first period P1 and the second period P2, that is, make the first sensing unit SM1 repeatedly perform three times of biometric sensing procedure. The method of providing the aforementioned control signals by outputting multiple pulse voltages may make the sensing signals be superimposed so as to amplify sensing signals or obtain average sensing signals for eliminating noise, but not limited thereto. Similarly, in the seventh period P7 to the twelfth period P12, the control unit CU makes the second sensing unit SM2 perform the biometric sensing procedure and makes the first sensing unit SM1 be turned off. The second sensing component ST2 is turned on by the control signals transmitted from the sensing control line TX2 in the seventh period P7, the ninth period P9 and the eleventh period P11, such that the second electricity storage component C2 is charged. The second driving component DT2 is turned on by the control signals transmitted from the driving control line FX2 in the eighth period P8, the tenth period P10 and the twelfth period P12, such that the second electricity storage component C2 discharges. The operating method is the same as the operating method of the first sensing unit SM1 described above, and will not be redundantly described. In other words, the first sensing component ST1, the second sensing component ST2, the first driving component DT1 and the second driving component DT2 may be turned on in different timing by the control of the control unit CU, such that the first electricity storage component C1 and the second electricity storage component C2 are charged or discharge in different timing. It should be noted that the method of the present disclosure with providing the pulse voltages for performing the biometric sensing procedure is not limited to the aforementioned signal control method by successively providing three pulse voltages for the same sensing component. In other embodiments, one sensing component may be provided with one single pulse voltage, two successive pulse voltages or more than three successive pulse voltages for performing the biometric sensing procedure. Further, the present disclosure is not limited to process the sensing signals by superimposition or averaging.

In the operation of the thin film transistor, the gate may be provided a voltage higher than a threshold voltage of the thin film transistor, such that a semiconductor channel that allows electrons or holes flowing in the semiconductor channel layer is occurred. If an extra energy such as light is provided to the semiconductor channel layer, the amounts of the electrons or the holes in the channel would be increased, so as to make the threshold voltage be shifted. Furthermore, when the light intensity is greater, the shift of the threshold voltage is greater accordingly. Thus, the present disclosure utilizes the characteristic of the shift of the threshold voltage of the thin film transistor due to illumination of light for performing the optical-type biometric sensing. In detail, the semiconductor channel layers of the sensing components such as the first sensing component ST1 and the second sensing component ST2 are utilized for being illuminated by the light transmitting through the finger or reflected by the finger. When the light intensity is greater, the shift of the threshold voltage is greater. Specifically, when the semiconductor channel layer of a sensing component is illuminated by the light that transmits through or reflected from the biometric ridge (such as a fingerprint ridge), the sensing component would have a first shifting threshold voltage. Accordingly, when the sensing component is turned on, the corresponding coupled electricity storage component would be charged to a voltage which is a difference between the source voltage and the first shifting threshold voltage, and this voltage is defined as a first voltage in the present disclosure. When the semiconductor channel layer of the sensing component is illuminated by the light that transmits through or reflected from the biometric valley (such as a fingerprint valley), the sensing component would have a second shifting threshold voltage. Therefore, when the sensing component is turned on, the corresponding coupled electricity storage component would be charged to a voltage which is a difference between the source voltage and the second shifting threshold voltage, and this voltage is defined as a second voltage. In addition, when the sensing component is not illuminated with the light, the threshold voltage of the sensing component would not be shifted or change. Accordingly, when the sensing component is turned on, the correspondingly coupled electricity storage component would be charged to a voltage which is a difference between the source voltage and the original threshold voltage, and this voltage is defined as a third voltage. In this embodiment, the sensing component illuminated by the light reflected from the finger, thus the intensity of light reflected from the biometric ridge is greater than the intensity of light reflected from the biometric valley, such that the shift of the first shifting threshold voltage is greater than the shift of the second shifting threshold voltage. Due to the value difference of the first voltage, the second voltage and the third voltage described above, the biometric sensing device FP can recognize the profile of the biometric. In a variant embodiment, the light source (for example, infrared (IR) light) may directly illuminate the back of the finger or laterally illuminate the finger and then the light that passes through the finger and the biometric with different intensity corresponding to the biometric features would be produced and enter the biometric sensing device FP. In this case, the first shifting threshold voltage may be greater than the second shifting threshold voltage, which means the intensity of the light transmitting the biometric valley is greater than the intensity of the light transmitting the biometric ridge.

In this embodiment, the size of each of the sensing units is about 50 µm*50 µm, the capacitance of the first electricity storage component C1 and the second electricity storage component C2 is about 200 fF for example, and the difference between the first shifting threshold voltage and the second shifting threshold voltage may ranges from about 0.05 volts to 0.2 volts, but not limited thereto. Thus, when the first sensing unit SM1 and the second sensing unit SM2 respectively sense the biometric ridge and the biometric valley, a difference ΔQ between the electric charges stored in the first electricity storage component C1 and the electric charges stored in the second electricity storage component C2 may be 10 fC~40 fC (wherein the calculation method of the difference ΔQ of the electric charges is the capacitance 200 fF multiplied by the difference between the first shifting threshold voltage and the second shifting threshold voltage). Compared with the conventional biometric sensing device that the sensing electrodes is directly disposed for sensing capacitive coupling value with the biometric, in the condition that the sensing components have the same size, the biometric sensing signal intensity of the conventional biometric sensing device is about 2.5 fC, and the biometric sensing signal intensity of this embodiment can be increased to about 4~16 times referring to the conventional biometric sensing device.

The method of performing the biometric sensing procedure by the first sensing unit SM1 and the second sensing unit SM2 is described in the following. For example, the first sensing unit SM1 is near the biometric ridge and the second sensing unit SM2 is near the biometric valley. The first electricity storage component C1 would be charged to the first voltage in the first period P1, the third period P3 and the fifth period P5, and the first electricity storage component C1 would release the stored electric charges to the arithmetic unit AU in the second period P2, the fourth period P4 and the sixth period P6, so as to know the position sensed by the first sensing unit SM1 is the biometric ridge. In another aspect, the second electricity storage component C2 would be charged to the second voltage in the seventh period P7, the ninth period P9 and the eleventh period P11, and the second electricity storage component C2 would release the stored electric charges to the arithmetic unit AU in the eighth period P8, the tenth period P10 and the twelfth period P12, so as to know the position sensed by the second sensing unit SM2 is the biometric valley. Therefore, the biometric features sensed by the sensing components can be determined according to the stored electric charges or the voltages of the electricity storage components, so as to obtain the profile of the biometric or perform the biometric recognition process.

In addition, since the shift degree of the threshold voltage of the thin film transistor does not depend on the size of the thin film transistor, the size of the sensing components may be reduced for achieving high resolution measurement or saving space. Besides, because the biometric features are calculated according to the voltages of the electricity storage components or the electric charges stored in the electricity storage components, the IC chips used in the arithmetic unit AU may be conventional arithmetic chips utilized for calculating the coupling between the sensing electrodes and the biometric.

Referring to FIG. 1, the biometric sensing device FP1 of this embodiment may be applied to a display device DP1. The display device DP1 of this embodiment is a liquid crystal display device for example, but not limited thereto. The display device DP1 may be a quantum dot (QD) display device or a self-luminous type display device such as an organic light-emitting diode (OLED) display device or an inorganic micro light-emitting diode (micro-LED) display device. The display device DP1 includes a periphery region and a display region. A plurality of scan lines SL and a plurality of data lines DL are disposed in the display region, and a plurality of sub-pixels PIX are defined. Each sub-pixel PIX includes at least one pixel transistor PT for switching the sub-pixel PIX and a display capacitor Clc. One node of the display capacitor Clc may be coupled with a common voltage Com, and another node of the display capacitor Clc is coupled with a drain of the pixel transistor PT. A gate of the pixel transistor PT is coupled with the scan line SL, and a source of the pixel transistor PT is coupled with the data lines DL. The control unit CU and the arithmetic unit AU of the biometric sensing device FP1 of this embodiment are disposed in the periphery region of the display device DP1, and the biometric recognition area having the first sensing unit SM1 and the second sensing unit SM2 is disposed in the display region of the display device DP1. For example, in an overlapping area of the biometric recognition area and the display region, the sensing units and the sub-pixels PIX are alternately disposed between adjacent data lines DL, but not limited thereto. It should be noted that the OLED display device or the micro-LED display device includes a plurality of driving circuits and a plurality of light-emitting units which are periodically arranged. In these display devices, each sub-pixel PIX includes one driving circuit and one light-emitting unit electrically connected to the driving circuit, wherein the driving circuit includes at least one transistor, and the light-emitting unit includes an anode, a light-emitting layer and a cathode.

The biometric sensing device of the present disclosure is not limited to the above embodiments. Further embodiments or variant embodiments of the present disclosure are described below. To simplify the description, the identical components in the following embodiments are marked with identical symbols. For making it easier to compare the difference between the embodiments, the following description will detail the dissimilarities among different embodiments and the identical features will not be redundantly described.

Figure 3:
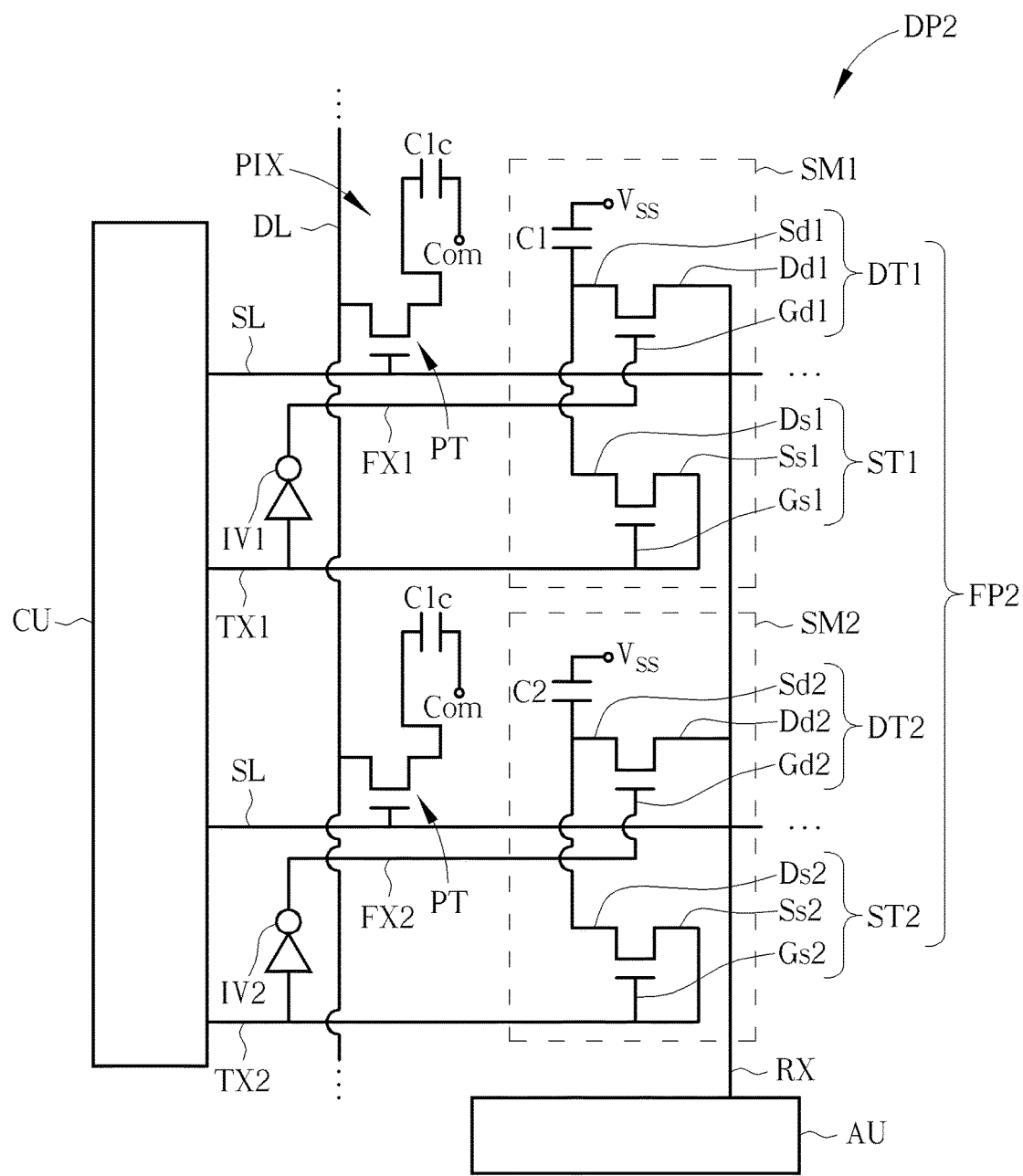
FIG. 3 is a schematic diagram of circuit architecture according to a second embodiment of a biometric sensing device of the present disclosure.

Referring to FIG. 3, FIG. 3 is a schematic diagram of circuit architecture according to a second embodiment of a biometric sensing device. As shown in FIG. 3, the difference between this embodiment and the first embodiment is that the biometric sensing device FP2 of this embodiment may further include flip-flops IV1, IV2. Two nodes of the flip-flop IV1 are respectively coupled with the gate Gs1 of the first sensing component ST1 and the gate Gd1 of the first driving component DT1, and two nodes of the flip-flop IV2 are respectively coupled with the gate Gs2 of the second sensing component ST2 and the gate Gd2 of the second driving component DT2. In addition, the first sensing unit SM1 and the second sensing unit SM2 respectively include one control line coupled with the control unit CU. For example, in the first sensing unit SM1 of this embodiment, the sensing control line TX1 is coupled with the gate Gs1 of the first sensing component ST1, the control unit CU and one of the nodes of the flip-flop IV1, and the driving control line FX1 is coupled with the gate Gd1 of the first driving component DT1 and the other node of the flip-flop IV1, but not directly connected to the control unit CU. Thus, the control unit CU may provide one control signal for controlling the switching function of the first sensing component ST1 and the first driving component DT1 simultaneously, such that the first sensing component ST1 and the first driving component DT1 are turned on at different timing. Similarly, the sensing control line TX2 of the first sensing unit SM2 is coupled with the gate Gs2 of the second sensing component ST2, the control unit CU and one of the nodes of the flip-flop IV2, and the driving control line FX2 is coupled with the gate Gd2 of the second driving component DT2 and the other node of the flip-flop IV2, but not directly connected to the control unit CU. Therefore, the control unit CU may provide one control signal for controlling the switching function of the second sensing component ST2 and the second driving component DT2 simultaneously, such that the second sensing component ST2 and the second driving component DT2 are turned on at different timing. The control signals of the control unit CU of the biometric sensing device FP2 and the charging period of the electricity storage components C1, C2 may be referred to FIG. 2, and will not be redundantly described. It should be noted that when the biometric sensing device FP2 of this embodiment is applied to a display device DP2, the flip-flops IV1, IV2 may be disposed in the periphery region of the display device DP2, but not limited thereto. According to the component architecture of this embodiment, the number of the control lines connected to the control unit CU may be reduced, which can save the arrangement space for disposing the conductive lines around the control unit CU.

Figure 4:
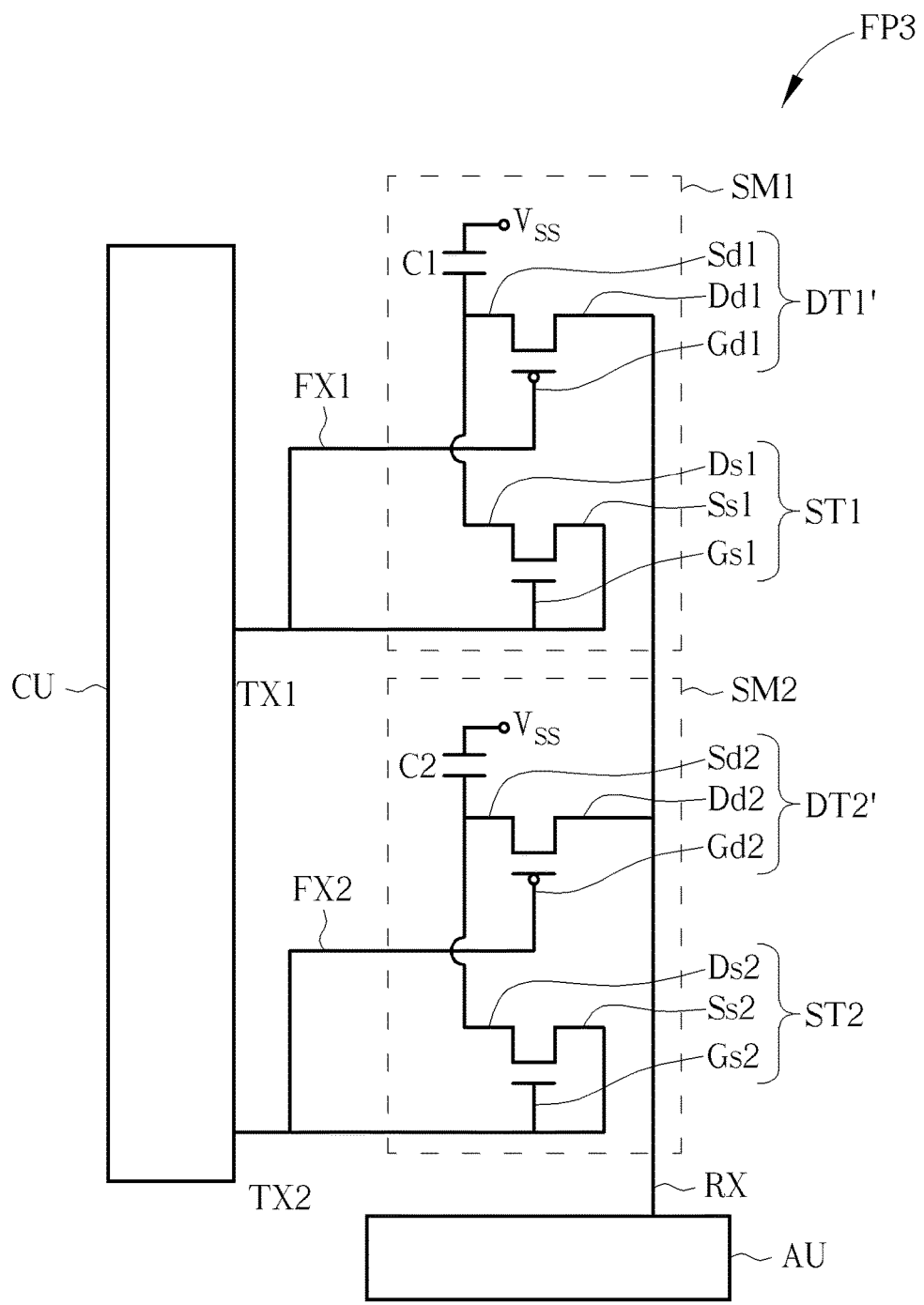
FIG. 4 is a schematic diagram of circuit architecture according to a third embodiment of a biometric sensing device of the present disclosure.
Figure 5:
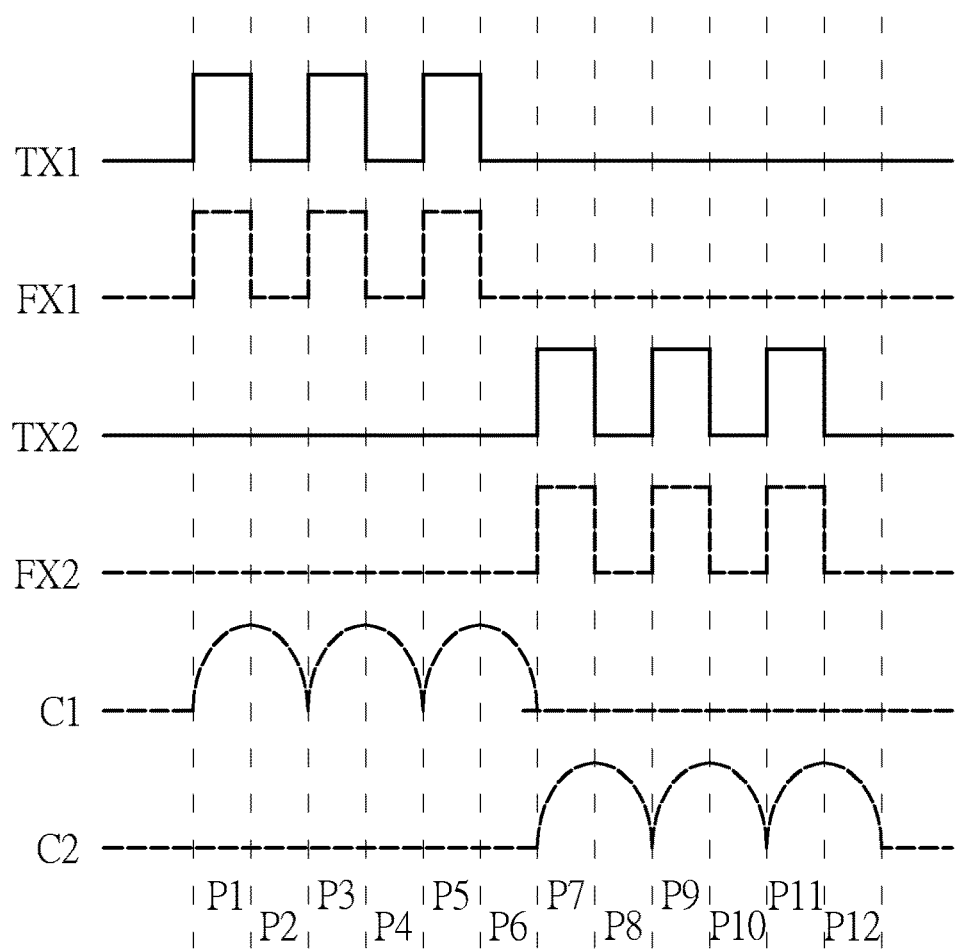
FIG. 5 is a schematic diagram of charging procedure of the electricity storage component and control signals according to the third embodiment of the biometric sensing device of the present disclosure.

Referring to FIG. 4 and FIG. 5, FIG. 4 is a schematic diagram of circuit architecture according to a third embodiment of a biometric sensing device of the present disclosure, and FIG. 5 is a schematic diagram of charging procedure of the electricity storage component and control signals according to the third embodiment of the biometric sensing device of the present disclosure. The difference between this embodiment and the first embodiment is that a channel polarity of the first driving component DT1' and a channel polarity of the first sensing component ST1 of the biometric sensing device FP3 of this embodiment are opposite, and a channel polarity of the second driving component DT2' and a channel polarity of the second sensing component ST2 of the biometric sensing device FP3 are opposite, too. For example, the first sensing component ST1 and the second sensing component ST2 are N-type transistors (such as NMOS transistors), and the first driving component DT1' and the second driving component DT2' are P-type transistors (such as PMOS transistors), but not limited thereto. In this embodiment, the gate Gd1 of the first driving component DT1' is coupled with both the control unit CU and the gate Gs1 of the first sensing component ST1 through the driving control line FX1 and the sensing control line TX1, and the gate Gd2 of the second driving component DT2' is coupled with both the control unit CU and the gate Gs2 of the second sensing component ST2 through the driving control line FX2 and the sensing control line TX2. Furthermore, the driving control line FX1 is indirectly coupled with the control unit CU through the sensing control line TX1, and the driving control line FX2 is indirectly coupled with the control unit CU through the sensing control line TX2. As shown in FIG. 5, in this embodiment, the first sensing component ST1 and the first driving component DT1' receive the same control signal outputted from the control unit CU through the driving control line TX1 at the same period. However, since the channel polarities of the transistors are opposite, the control unit CU still turns on the first sensing component ST1 and turns off the first driving component DT1' for making the first electricity storage component C1 be charged in the first period P1, the third period P3 and the fifth period P5, and turns on the first driving component DT1' and turns off the first sensing component ST1 for making the electric charges stored in the first electricity storage component C1 be released in the second period P2, the fourth period P4 and the sixth period P6, so as to perform the process of sensing the biometric features. The second sensing component ST2 and the second driving component DT2' are turned on or off by the similar operation method in the seventh period P7 to the twelfth period P12, and will not be redundantly described. From the above, the control unit CU may control the switching of the sensing component and the driving component in the same sensing unit at the same time by providing one control signal. This architecture may decrease the number of the control lines connected to the control unit CU, so as to save the arrangement space of conductive lines around the control unit CU and further reduce the size of the product. Furthermore, the biometric sensing device FP3 of this embodiment is an independent electronic device for example, so the components of the display device are not shown in FIG. 4. However, in a variant embodiment, the biometric sensing device FP3 may be utilized in a display device, similar to the first embodiment, and the first sensing unit SM1 and the second sensing unit SM2 are alternately disposed with the components of the sub-pixels of the display device.

Figure 6:
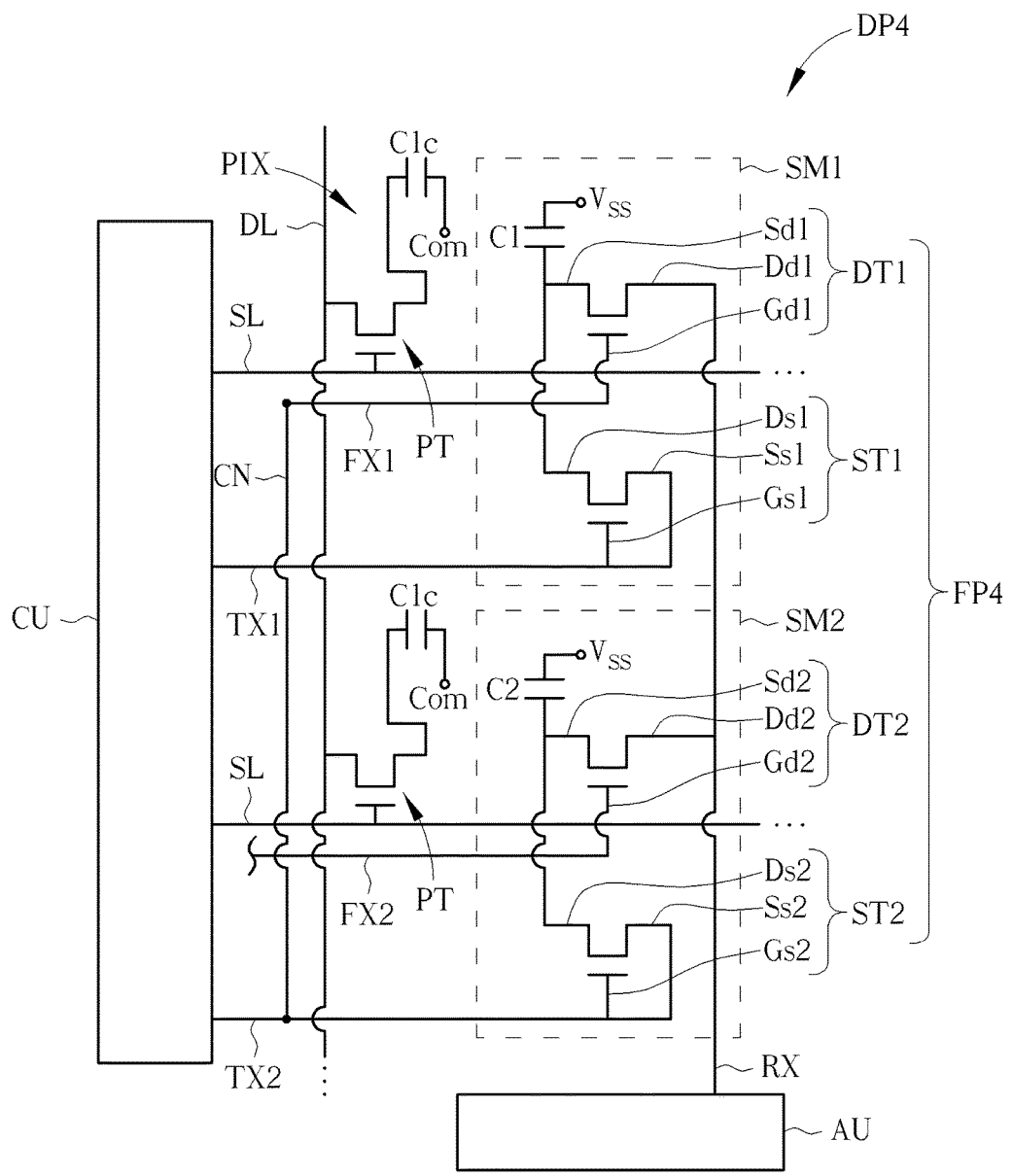
FIG. 6 is a schematic diagram of circuit architecture according to a fourth embodiment of a biometric sensing device of the present disclosure.
Figure 7:
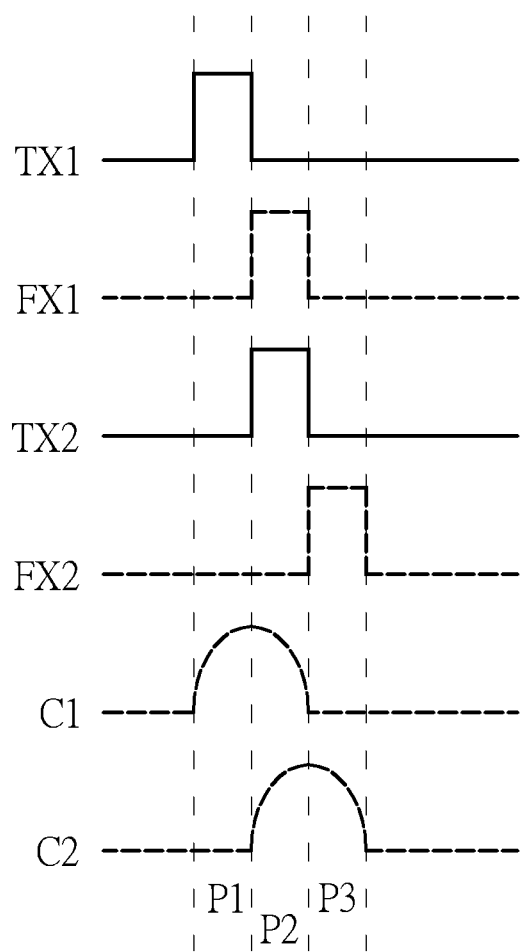
FIG. 7 is a schematic diagram of charging procedure of the electricity storage component and control signals according to the fourth embodiment of the biometric sensing device of the present disclosure.

Referring to FIG. 6 and FIG. 7, FIG. 6 is a schematic diagram of circuit architecture according to a fourth embodiment of a biometric sensing device of the present disclosure, and FIG. 7 is a schematic diagram of charging procedure of the electricity storage component and control signals according to the fourth embodiment of the biometric sensing device of the present disclosure. The difference between this embodiment and the first embodiment is that the gate Gd1 of the first driving component DT1 of the biometric sensing device FP4 in the circuit architecture of this embodiment is coupled with the gate Gs2 of the second sensing component ST2 through the driving control line FX1, a connection line CN and the sensing control line TX2, and is coupled with the control unit CU through the sensing control line TX2. In other words, when the biometric sensing device FP4 has a plurality of sensing units, the driving control line FXn of the $n^{th}$ sensing unit is coupled with the sensing control line TX (n+1) of the $(n+1)^{th}$ sensing unit. In this embodiment, the electricity storage components of the first sensing unit SM1 and the second sensing unit SM2 are charged by one single pulse as an example. In the first period P1, the control unit CU outputs a high-voltage control signal to the sensing control line TX1, while outputs low-voltage control signal(s) or no signals to other sensing control lines, so as to turn on the first sensing component ST1 of the first sensing unit SM1 and make the first electricity storage component C1 be charged. In the second period P2, the control unit CU outputs a high-voltage control signals to the sensing control line TX2, but outputs low-voltage control signal(s) or no signals to other sensing control lines, so as to turn on the second sensing component ST2 of the second sensing unit SM2 and make the second electricity storage component C2 be charged; meanwhile, the driving control line FX1 coupled with the sensing control line TX2 also send out the high-voltage control signal for turning on the first driving component DT1 of the first sensing unit SM1, so as to release the electric charges stored in the first electricity storage component C1. In the third period P3, the control unit CU outputs a high-voltage control signal to the sensing control line TX3 (not shown in figure), but outputs low-voltage control signal(s) or no signals to other sensing control lines (such as the sensing control lines TX1 and TX2), so as to turn on the second driving component DT2 of the second sensing unit SM2 and release the electric charges stored in the second electricity storage component C2. By the aforementioned deposition and operation method, the control unit CU may control the switching function of the first sensing component ST1, the first driving component DT1, the second sensing component ST2 and the second driving component DT2 through less control signals, and the deposition of the driving control lines may be decreased. When the biometric sensing device FP4 is applied to the display device DP4, the connection line CN may be situated outside the biometric recognition area, for example, in the periphery region of the display device, but not limited thereto. In a variant embodiment, the connection line CN may be situated in the biometric recognition area. For example, the connection line CN may be disposed between one data line DL and one signal receiving line RX adjacent to the data line DL. In the case of the circuit architecture of this embodiment, the arrangement of the driving control lines, the sensing control lines and the connection line is more flexible, and the opening ratio of the pixels may be even increased by adjusting the arranged position of the driving control lines. In another aspect, since the driving control lines can be coupled with the control unit CU through the sensing control lines, the arrangement space of the conductive lines around the control unit CU may be reduced.

Figure 8:
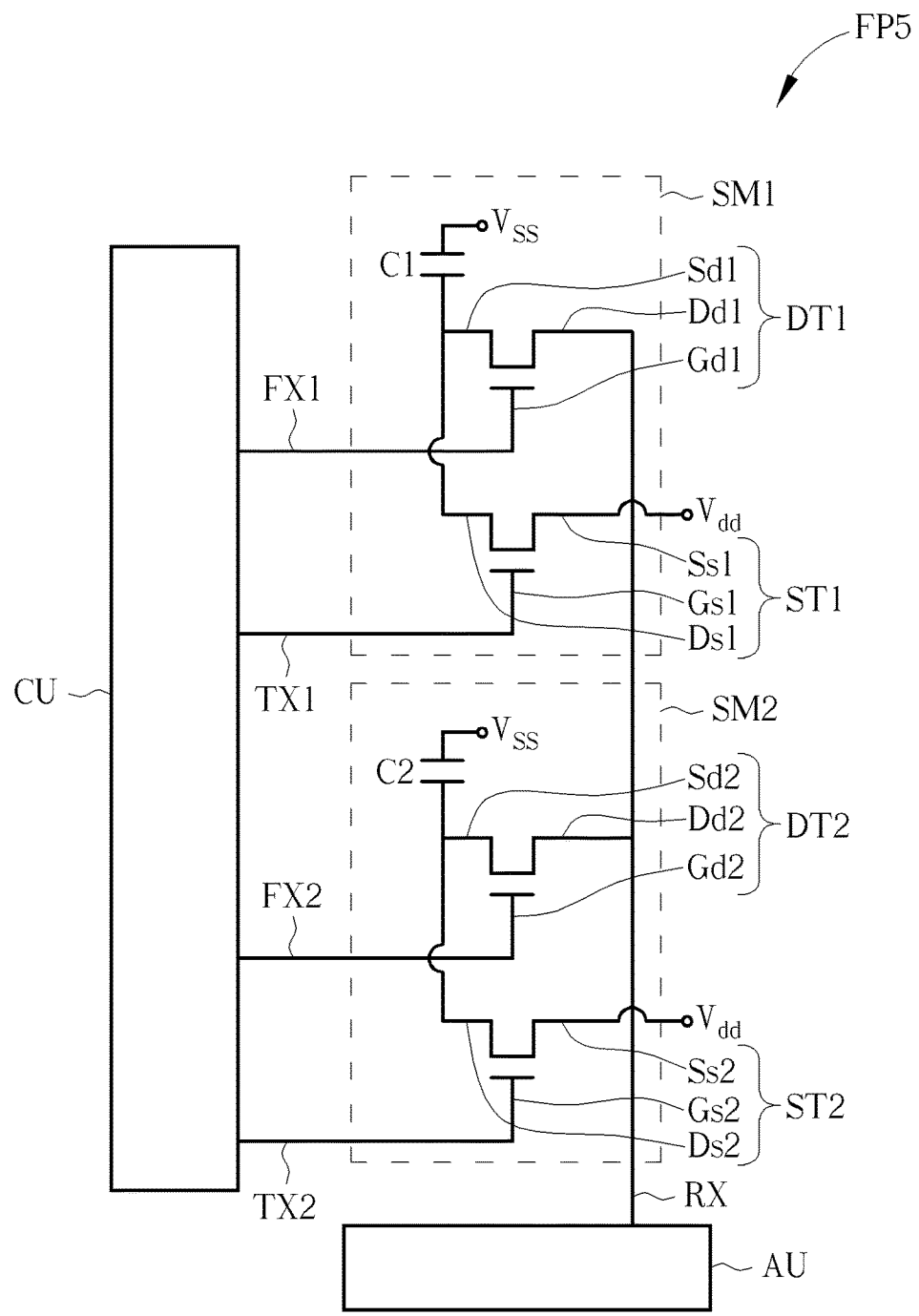
FIG. 8 is a schematic diagram of circuit architecture according to a fifth embodiment of a biometric sensing device of the present disclosure.

Referring to FIG. 8, FIG. 8 is a schematic diagram of circuit architecture according to a fifth embodiment of a biometric sensing device of the present disclosure. The difference between this embodiment and the first embodiment is that the source Ss1 of the first sensing component ST1 and the source Ss2 of the second sensing component ST2 in the biometric sensing device FP5 of this embodiment are both coupled with a voltage source Vdd, wherein a voltage of the voltage source Vdd may be greater than or equal to the high voltage (or high-voltage control signal) provided from the control unit CU. For example, the high-voltage control signal provided from the control unit CU may be 5 volts, and the voltage source Vdd may have a voltage of 5 volts or greater than 5 volts. Therefore, when the first sensing component ST1 or the second sensing component ST2 is turned on, the corresponding first electricity storage component C1 or the second electricity storage component C2 is charged through the voltage source Vdd.

The display device having the biometric sensing device will be further disclosed in the following. It is needed to state that although the circuit architecture of the biometric sensing device and/or the circuit architecture of the display device described in the aforementioned first embodiment are taken as examples in the following embodiments, the present disclosure is not limited thereto and the circuit architectures of the following embodiments may be replaced by any of the aforementioned embodiments or variant embodiments.

Figure 9:
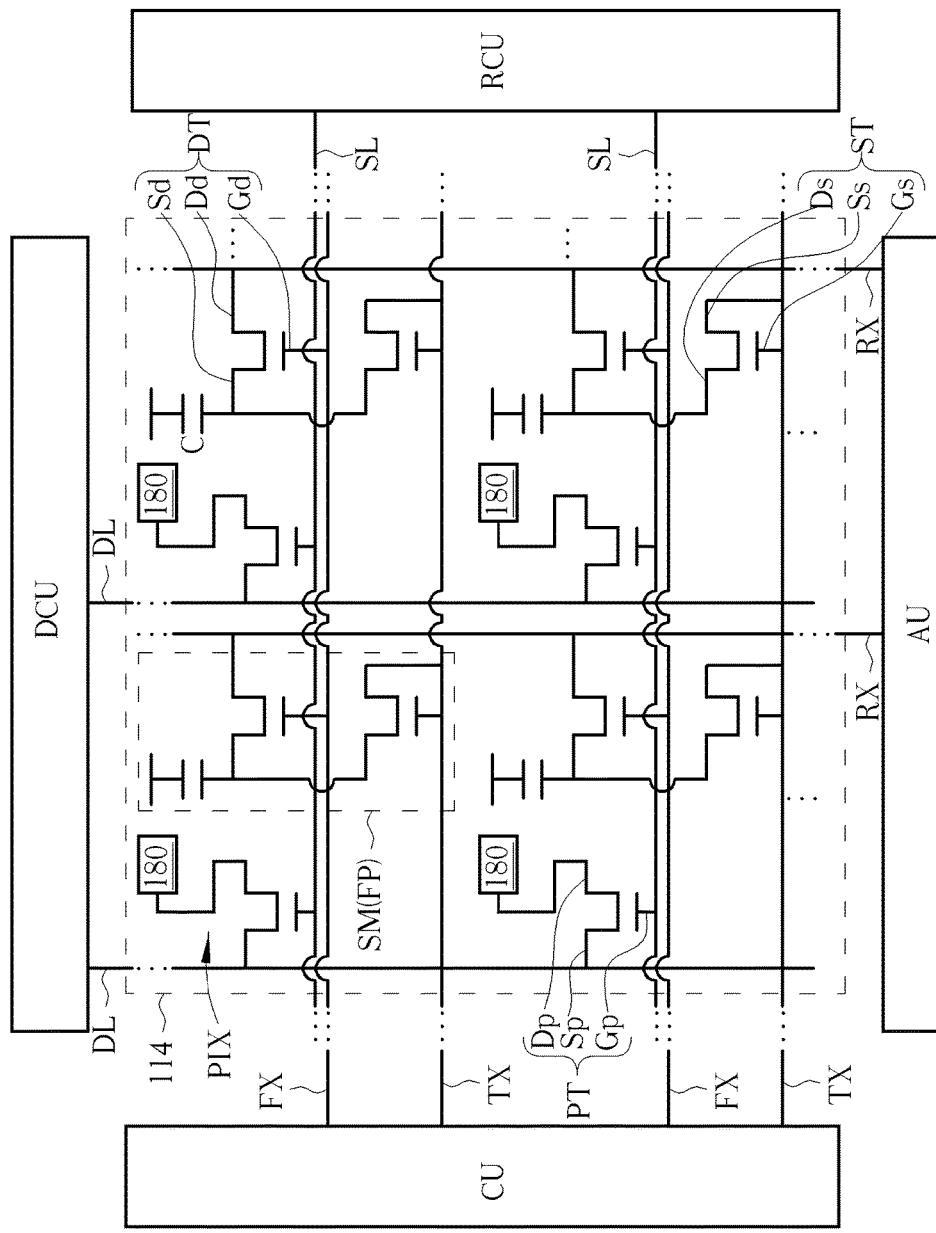
FIG. 9 is a schematic diagram of circuit architecture of pixel transistors and biometric sensing device according to a first embodiment of a display device of the present disclosure.
Figure 10:
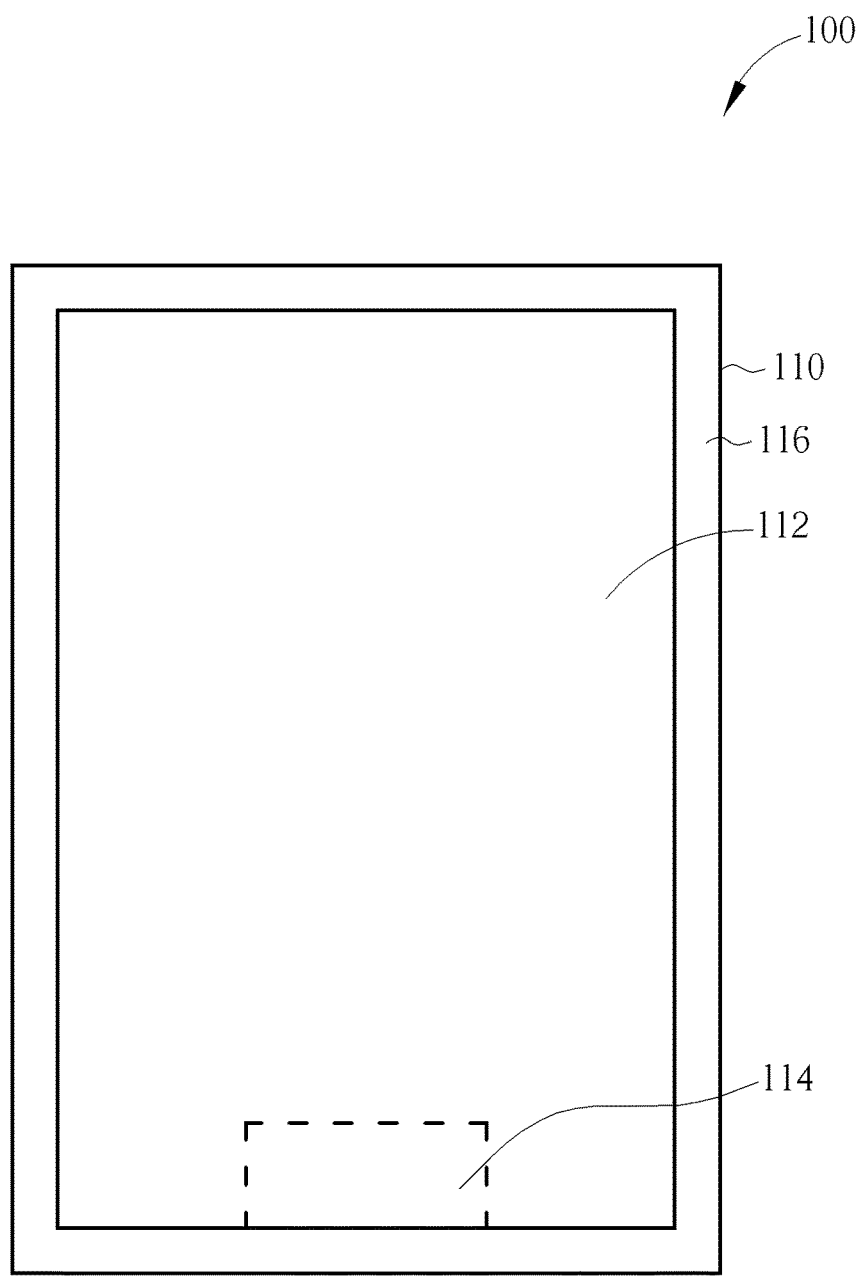
FIG. 10 is a top-view schematic diagram according to the first embodiment of the display device of the present disclosure.
Figure 11:
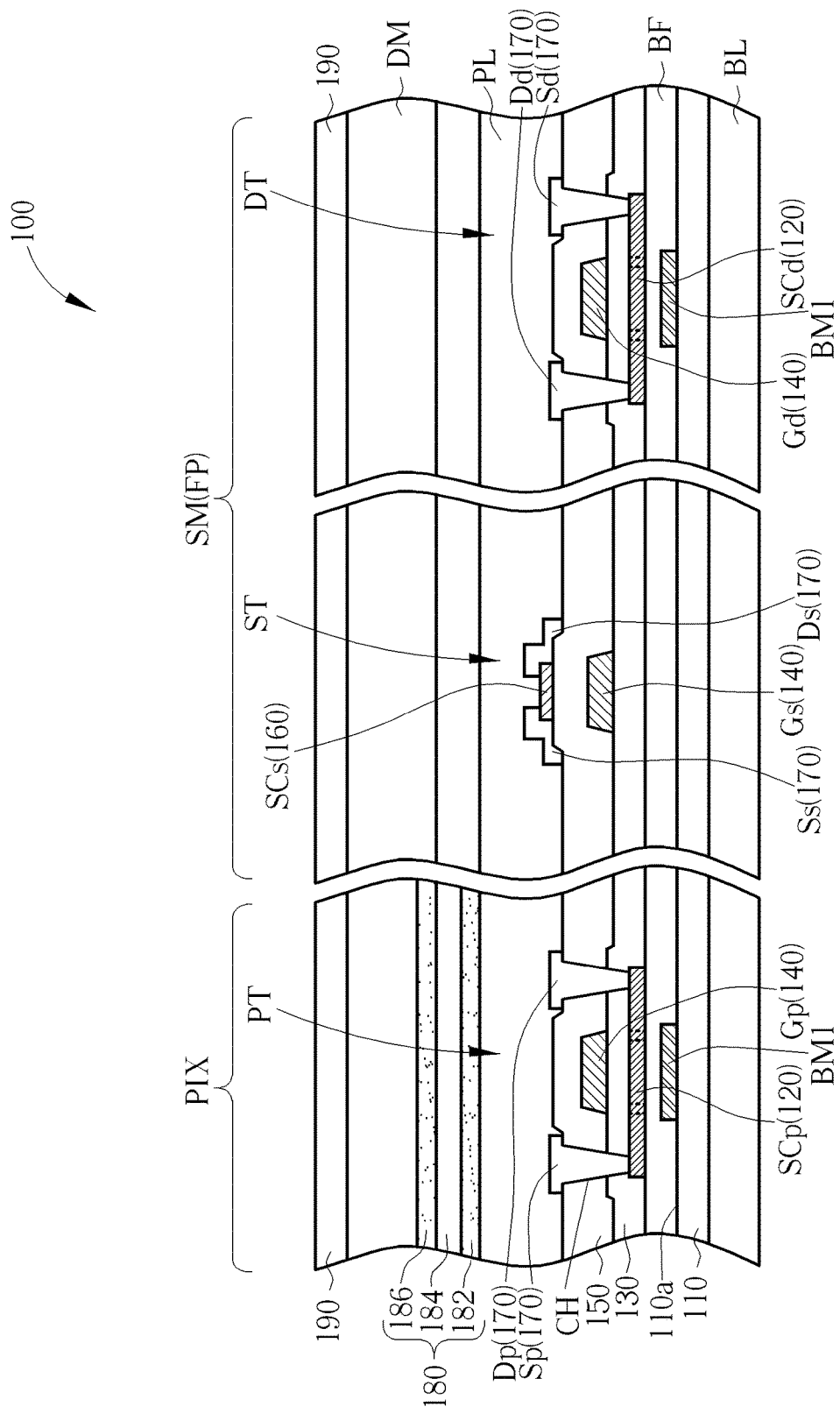
FIG. 11 is a schematic diagram of a partial cross-sectional view according to the first embodiment of the display device of the present disclosure.

Referring to FIG. 9 to FIG. 11, FIG. 9 is a schematic diagram of circuit architecture of pixel transistors and biometric sensing device according to a first embodiment of a display device of the present disclosure, FIG. 10 is a top-view schematic diagram according to the first embodiment of the display device of the present disclosure, and FIG. 11 is a schematic diagram of a partial cross-sectional view according to the first embodiment of the display device of the present disclosure. The display device 100 of this embodiment includes a first substrate 110, a second substrate 190, a plurality of sub-pixels PIX and a biometric sensing device FP, wherein each of the sub-pixels PIX includes at least one pixel transistor PT and at least one display component 180. The display device 100 of the present disclosure is a liquid crystal display device for example, but not limited thereto. The display device 100 may be an OLED display device or a micro-LED display device in variant embodiments. A surface of the first substrate 110 includes a display region 112 and a periphery region 116 disposed at a surrounding of the display region 112. The first substrate 100 further includes the biometric recognition area 114 for disposing the main sensing components of the biometric sensing device FP. In this embodiment, the biometric recognition area 114 may be situated in the display region 112 and overlap a portion of the display region 112, which means the biometric recognition area 114 could also display images. For example, the portion of the display region 112 overlapping the biometric recognition area 114 may display a plurality of virtual function keys, but not limited thereto. In other embodiments, the biometric recognition area 114 may be situated in the periphery region 116. As shown in FIG. 11, the second substrate 190 is disposed opposite to the first substrate 110, wherein the first substrate 110 and the second substrate 190 may be a hard substrate such as a glass substrate, a crystal substrate or a sapphire substrate, or may be a plastic substrate such as a flexible substrate including the material of polyimide (PI), polycarbonate (PC) or polyethylene terephthalate (PET), respectively, but not limited thereto. The pixel transistors PT and the display components 180 are disposed on a first surface 110a of the first substrate 110 and situated in the display region 112, wherein the first surface 110a faces to the second substrate 190. The biometric sensing device FP of this embodiment includes at least one sensing unit SM and a control unit CU, wherein the biometric sensing device FP illustrated FIG. 11 includes four sensing units SM as an example. The sensing units SM of this embodiment are disposed in the biometric recognition area 114 in the display region 112, and the control unit CU is disposed in the periphery region 116. The sensing units respectively include an electricity storage component C, a sensing component ST and a driving component DT coupled with the control unit CU through a plurality signal lines (such as the driving control lines FX and the sensing control lines TX). The sensing components ST are disposed in the biometric recognition area 114 and respectively coupled with one of the electricity storage components C. The driving components DT are respectively coupled with one of the electricity storage components C and one of the sensing components ST. The detailed coupling relation is the same as the biometric sensing device of the first embodiment described above, and will not be redundantly described. It is worth to note that one sub-pixel PIX is designed to correspond to one sensing unit SM in the portion of the display region 112 overlapped with the biometric recognition area 114 in this embodiment. As a result, one pixel transistor PT and one display component 180 correspond to one driving component DT and one sensing component ST, but not limited thereto.

As shown in FIG. 11, in this embodiment, the sensing components ST may be bottom-gate type thin film transistors, and the pixel transistors PT and the driving components DT may be top-gate type thin film transistors. Regarding the structure of stacked films, the display device 100 of this embodiment includes a first semiconductor layer 120, a first gate insulation layer 130, a first conductive layer 140, a second gate insulation layer 150, a second semiconductor layer 160 and a second conductive layer 170 which are disposed on the first surface 110a of the first substrate 100 from bottom to top in sequence. The first semiconductor layer 120 is a patterned film and includes the semiconductor channels SCp of the pixel transistors PT and the semiconductor channels SCd of the driving components DT. In this embodiment, the first semiconductor layer 120 is a low temperature poly-silicon (LTPS) film for example, but not limited thereto. The first gate insulation layer 130 is disposed on and covers the first semiconductor layer 120, so as to serve as a gate insulation layer of the pixel transistors PT and the driving components DT. The first gate insulation layer 130 may include silicon oxide, silicon nitride or silicon oxynitride. The patterned first conductive layer 140 is disposed on the first gate insulation layer 130 and includes the gates Gp of the pixel transistors PT, the gates Gs of the sensing components ST and the gates Gd of the driving components DT. The material of the first conductive layer 140 may include, but not limited to, metal material or transparent conductive material. The second gate insulation layer 150 is disposed on and covers the first conductive layer 140 for serving as a gate insulation layer of the sensing components ST. The second gate insulation layer 150 may include silicon oxide, silicon nitride or silicon oxynitride. The second semiconductor layer 160 is a patterned film which is disposed on the second gate insulation layer 150, and the second semiconductor layer 160 includes the semiconductor channels SCs of the sensing components ST. The sensing components ST sense the intensity of the light reflected from the biometric or the light transmitting through the biometric by the semiconductor channels SCs, so as to determine the biometric features. In this embodiment, the second semiconductor layer 160 includes amorphous silicon material for example, but not limited thereto. The second semiconductor layer 160 may include metal oxide material for instance in a variant embodiment. The patterned second conductive layer 170 is disposed on the second semiconductor layer 160 and the second gate insulation layer 150, and the second conductive layer 170 includes the sources Sp and drains Dp of the pixel transistors PT, the sources Ss and drains Ds of the sensing components ST, and the sources Sd and drains Dd of the driving components DT. The sources Sp and drains Dp of the pixel transistors PT may respectively be coupled with the semiconductor channels SCp of the pixel transistors PT through connection holes CH, and the sources Sd and drains Dd of the driving components DT may respectively be coupled with the semiconductor channels SCd of the driving components DT through the connection holes CH. The material of the second conductive layer 170 may include, but not limited to, metal material or transparent conductive material. As shown in FIG. 11, one can realized that each of the components of the biometric sensing device FP of this embodiment can be integrated in the display device 100 effectively. The display device 100 including the biometric sensing device FP may be accomplished by adding the second semiconductor layer 160 in the film structure of a conventional display device through simple manufacture processes. It should be noted that the sensing components ST are not limited to the bottom-gate type thin film transistors and the pixel transistors PT and the driving components DT are not limited to the top-gate type thin film transistors in the present disclosure. The sensing components ST, the pixel transistors PT and the driving components DT may be any types of thin film transistors, such as bottom-gate type thin film transistors or top-gate type thin film transistors, according to the requirement.

The display component 180 in each of the sub-pixels PIX of the display device 100 is disposed on the corresponding pixel transistor PT and respectively coupled with the drain Dp of the corresponding pixel transistor PT, so as to control the gray level of the displayed image. In this embodiment, the display components 180 may respectively include a pixel electrode 182, an insulator layer 184 and a common electrode 186 which are stacked from bottom to top in sequence, but not limited thereto. The positions of the pixel electrodes 182 and the common electrodes 186 may be exchanged. In another embodiment, when the display device 100 is an OLED display device, each of the display components 180 may include at least one OLED. In still another embodiment, when the display device 100 is an inorganic light-emitting diode display device, each of the display components 180 may include at least one inorganic light-emitting diode. In a further embodiment, when the display device 100 is a quantum dot (QD) display device, the display device 100 may include quantum dots. Moreover, in this embodiment, the display device 100 may selectively include a planar layer PL disposed between the display components 180 and the pixel transistors PT, and include a display medium layer DM and alignment layer(s) (not shown in figure) disposed between the second substrate 190 and the display components 180, wherein the display medium layer DM is a liquid crystal layer for example, but not limited thereto. Besides, the display device 100 may further include a plurality of data lines DL and a plurality of scan lines SL (as shown in FIG. 9). The data lines DL are coupled with the sources Sp of the corresponding pixel transistors PT respectively, so as to transmit gray level signals. The scan lines SL are coupled with the gates Gp of the corresponding pixel transistors PT respectively, so as to refresh the displayed images. In this embodiment, the data lines DL are coupled with a gray level control unit DCU that outputs the gray level signals, and the scan lines SL are coupled with a display refreshing control unit RCU that outputs display refreshing signals, but not limited thereto. The control units of the display device 100 may be integrated with each other, and their positions are not limited to the arrangement shown in FIG. 9.

On the other hand, referring to FIG. 11, the display device 100 of this embodiment may further include a backlight module BL disposed on a side of the first substrate 110 opposite to the first surface 110a. In other words, the first substrate 110 is disposed between the second substrate 190 and the backlight module BL. The backlight module BL is used for providing the light for displaying and sensing biometric. The light provided from the backlight module BL may include visible light, infrared (IR) light, ultraviolet (UV) light or a combination thereof. It should be noted that self-luminous display components of the self-luminous type display device may replace the backlight module BL, and the light provided from the self-luminous display components may also include visible light, IR light, UV light or a combination thereof. In addition, in order to prevent the semiconductor channels SCp of the pixel transistors PT and the semiconductor channels SCd of the driving components DT from being directly illuminated by the back light and therefore their threshold voltages and lifetime are affected, the display device 100 may further include a first shielding layer BM1 and a buffer layer BF. The first shielding layer BM1 is a patterned layer and is disposed between the first semiconductor layer 120 and the first substrate 110. The first shielding layer BM1 at least partially overlaps the pixel transistors PT and the driving components DT in a direction perpendicular to the first surface 110a. For example, the first shielding layer BM1 overlaps the semiconductor channels SCp of the pixel transistors PT and the semiconductor channels SCd of the driving components DT in the direction perpendicular to the first surface 110a. In another aspect, the buffer layer BF is disposed between the first shielding layer BM1 and the first semiconductor layer 120. The first shielding layer BM1 of this embodiment includes non-transparent material such as metal material or opaque non-metal material, and the buffer layer BF includes transparent insulating material, but not limited thereto. Besides, the display device 100 may include a second shielding layer (not shown in FIG. 9 to FIG. 11) disposed on a surface of the second substrate 190 for shielding the scan lines SL, the data lines DL or other non-transparent components or structures, but not limited thereto. The shielding function described above may be integrated in the first shielding layer BM1, or the second shielding layer may be disposed on the first substrate 110 in other embodiments.

Figure 12:
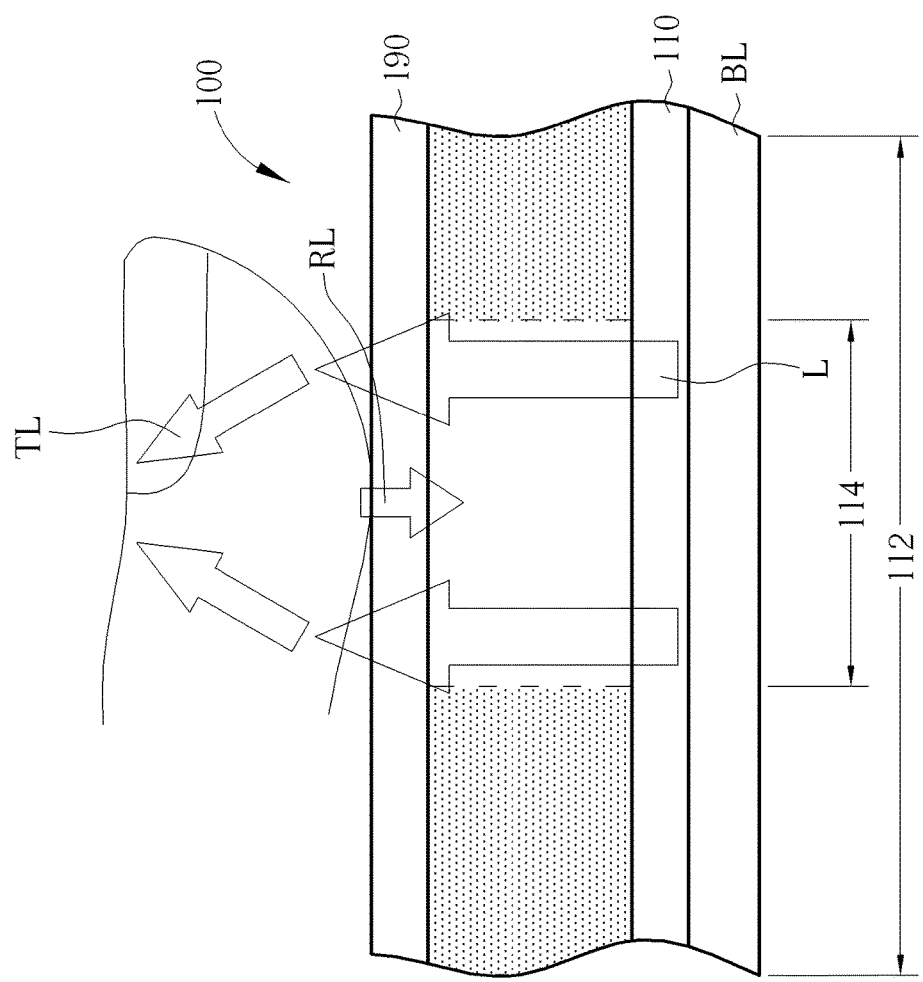
FIG. 12 is a schematic diagram of a cross-sectional view of the display device shown in FIG. 10 when performing biometric recognition.

Referring to FIG. 12, FIG. 12 is a cross-sectional schematic diagram of the display device shown in FIG. 10 when performing biometric recognition, wherein the biometric sensing device FP is not shown in FIG. 12. As shown in FIG. 12, when a finger approaches the display device 100 or contacts the display device 100 and is above the biometric recognition area 114 while the biometric sensing device FP is turned on, the light L provided by the backlight module BL will directly illuminate the biometric. Accordingly, a portion of the light L shown as the transmitting light TL will transmit through the finger, and a portion of the light L will be reflected by the finger as the reflective light RL, wherein the biometric ridge and the biometric valley will induce the reflective light RL having different intensity, such that the sensing units SM of the biometric sensing device FP can determine the biometric features according to the intensity of the sensed reflective light RL. In this embodiment, by controlling the display components 180, the biometric recognition area 114 may be adjusted to a light-transmissive state and the other portion of the display region 112 outside the biometric recognition area 114 may be adjusted to an opaque state (for example, the gray level of "0" or a lowest gray level), so as to decrease the interference of the light, but not limited thereto. In a variant embodiment, the backlight module BL may have a local dimming function, and therefore, by directly controlling the backlight module BL to partially emit light, the biometric recognition area 114 may be illuminated by the light emitted from the backlight module BL while the display region 112 outside the biometric recognition area 114 may not be illuminated. On the other hand, the biometric sensing device FP can be turned off when biometric recognition is not needed, so as to decrease the operation time of the sensing components ST of the biometric sensing device FP under the light illumination, and to extend the lifetime of the sensing components ST. In other words, the biometric sensing device FP would be turned on only when the biometric recognition is needed to be performed. Besides, the biometric recognition area 114 of this embodiment may further have a touch sensing function to serve as a touch key, which means the biometric sensing device FP may sense the touch of the finger through the sensing components ST to achieve the touch sensing function.

The display device of the present disclosure is not limited to the above embodiments. Further embodiments or variant embodiments of the present disclosure are described below. To simplify the description, the identical components in the following embodiments are marked with identical symbols. For making it easier to compare the difference between the embodiments, the following description will detail the dissimilarities among different embodiments and the identical features will not be redundantly described.

Figure 13:
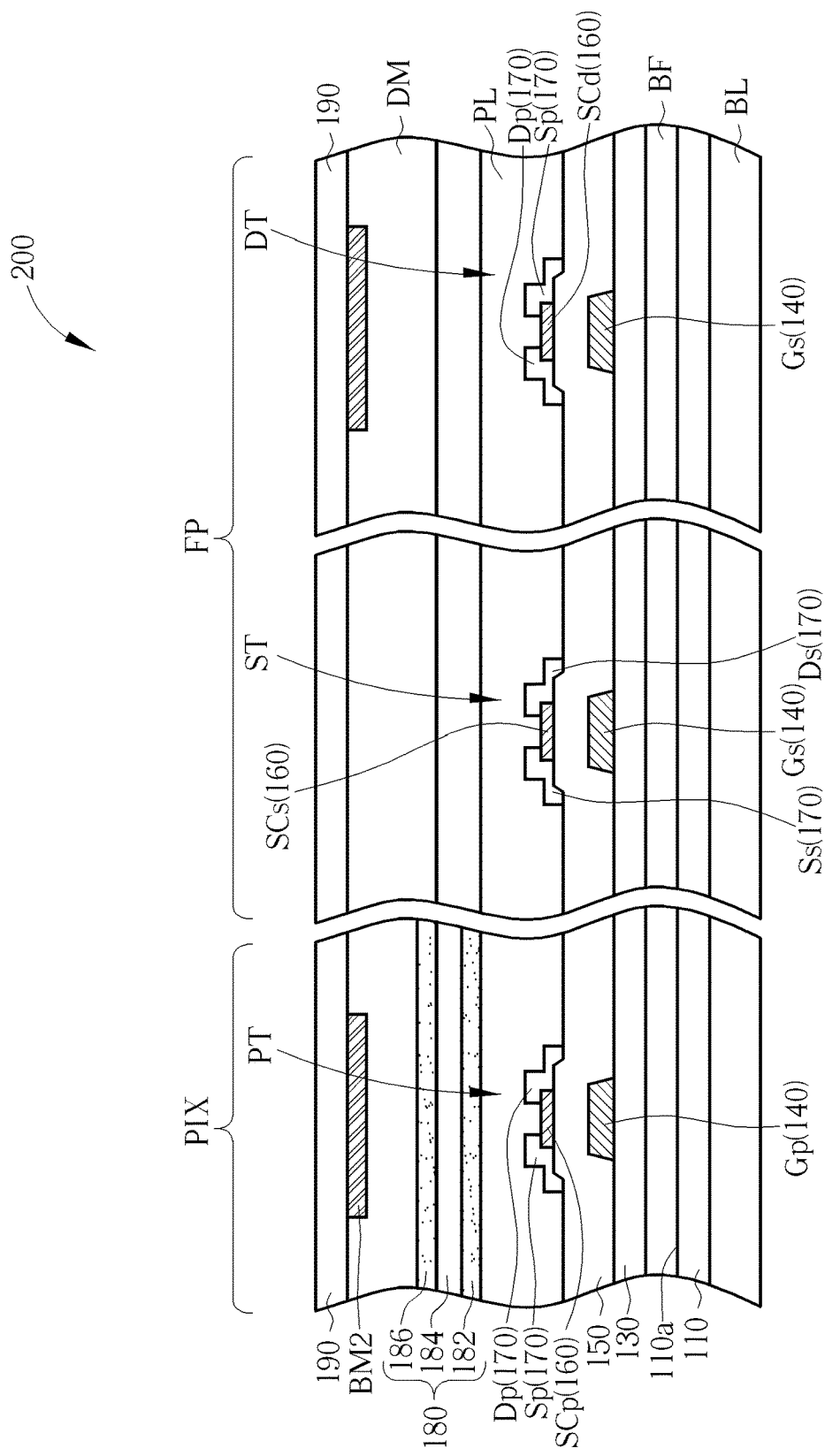
FIG. 13 is a schematic diagram of a partial cross-sectional view according to a second embodiment of a display device of the present disclosure.

Referring to FIG. 13, FIG. 13 is a schematic diagram of a partial cross-sectional view according to a second embodiment of a display device of the present disclosure. The difference between this embodiment and the first embodiment is that the pixel transistors PT, the sensing components ST and the driving components DT of the display device 200 of this embodiment are all bottom-gate type thin film transistors which have the structures similar to the sensing component ST shown in FIG. 11. Therefore, the display device 200 may include only one semiconductor layer (the second semiconductor layer 160) and the first semiconductor layer 120 shown in FIG. 11 is not needed. The second semiconductor layer 160 of this embodiment includes the semiconductor channels SCp of the pixel transistors PT, the semiconductor channels SCs of the sensing components ST and the semiconductor channels SCd of the driving components DT. In this design, in order to prevent the semiconductor channels SCp of the pixel transistors PT and the semiconductor channels SCd of the driving components DT from being directly illuminated by the reflective light RL reflected by the biometric, the display device 200 may include a second shielding layer BM2 disposed on the surface of the second substrate 190, wherein the second shielding layer BM2 overlaps the pixel transistors PT and the driving components DT in the direction perpendicular to the first surface 110a, so as to avoid the influence on the threshold voltages of the pixel transistors PT and the threshold voltages of the driving components DT due to the reflective light RL. The second shielding layer BM2 may include opaque material such as metal, black photoresist material or black organic material, but not limited thereto. It is worth to note that since the pixel transistors PT, the sensing components ST and the driving components DT of this embodiment are bottom-gate type thin film transistors, the semiconductor channels SCp, SCs, SCd will not be directly illuminated by the light emitted from the backlight module BL. Therefore, the display device 200 of this embodiment may not have the first shielding layer BM1. In a variant embodiment, the aforementioned first gate insulation layer 130 and buffer layer BF may not be disposed in the display device 200 either, but not limited thereto.

Figure 14:
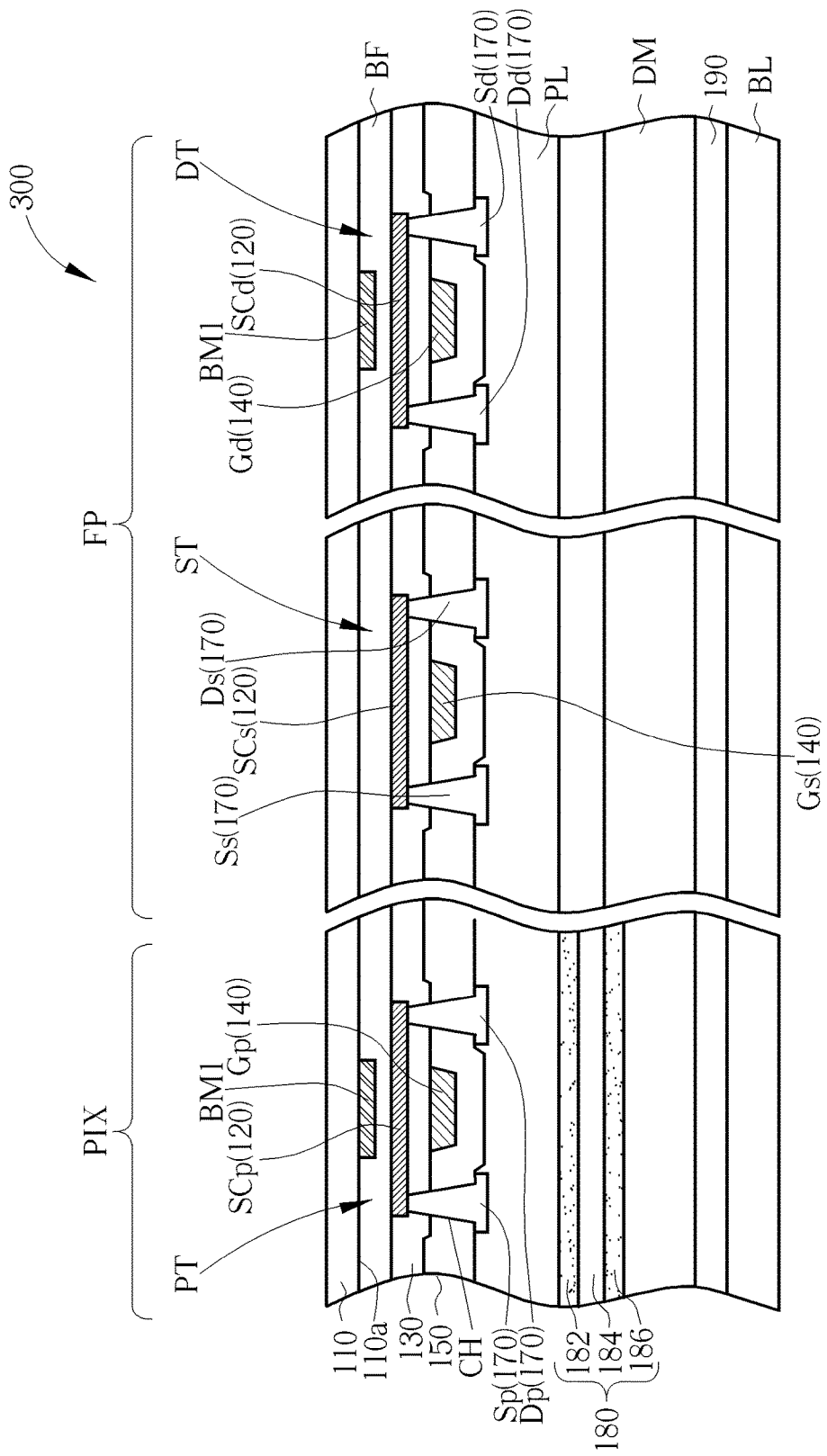
FIG. 14 is a schematic diagram of a partial cross-sectional view according to a third embodiment of a display device of the present disclosure.

Referring to FIG. 14, FIG. 14 is a schematic diagram of a partial cross-sectional view according to a third embodiment of a display device of the present disclosure. One difference between this embodiment and the first embodiment is that the disposition of the second substrate 190, the first substrate 110 and the components disposed there between of the display device 300 of this embodiment are disposed upside down compared with the first embodiment. Specifically, the second substrate 190 is disposed between the first substrate 110 and the backlight module BL, and therefore the light emitted from the backlight module BL firstly passes through the second substrate 190 and then passes through the first substrate 110. Another difference between this embodiment and the first embodiment is that the pixel transistors PT, the sensing components ST and the driving components DT of the display device 300 of this embodiment are top-gate type thin film transistors with the structure similar to the pixel transistors PT and the driving components DT shown in FIG. 11. In detail, the first semiconductor layer 120 includes the semiconductor channels SCp of the pixel transistors PT, the semiconductor channels SCs of the sensing components ST and the semiconductor channels SCd of the driving components DT. The first gate insulation layer 130 is utilized for being the gate insulation layer of the pixel transistors PT, the sensing components ST and the driving components DT. The first conductive layer 140 includes the gates Gp of the pixel transistors PT, the gates Gs of the sensing components ST and the gates Gd of the driving components DT. The second conductive layer 170 includes the sources Sp and the drains Dp of the pixel transistors PT, the sources Ss and the drains Ds of the sensing components ST and the sources Sd and the drains Dd of the driving components DT. The above-mentioned sources Sp, Ss, Sd and drains Dp, Ds, Dd may be respectively coupled with the corresponding semiconductor channels SCp, SCs, SCd through a connection hole CH. Similarly, the display device 300 may also include the first shielding layer BM1 disposed between the first semiconductor layer 120 and the first substrate 110, wherein the first shielding layer BM1 at least partially overlaps the pixel transistors PT and the driving components DT in the direction perpendicular to the first surface 110a, so as to prevent the semiconductor channels SCp of the pixel transistors PT and the semiconductor channels SCd of the driving components DT from being directly illuminated by the reflective light RL reflected from the biometric that affects the threshold voltages thereof. In this embodiment, the sensing components ST sense the intensity of the reflective light RL reflected from the biometric through the semiconductor channels SCs included by the first semiconductor layer 120, so as to determine the biometric features.

Figure 15:
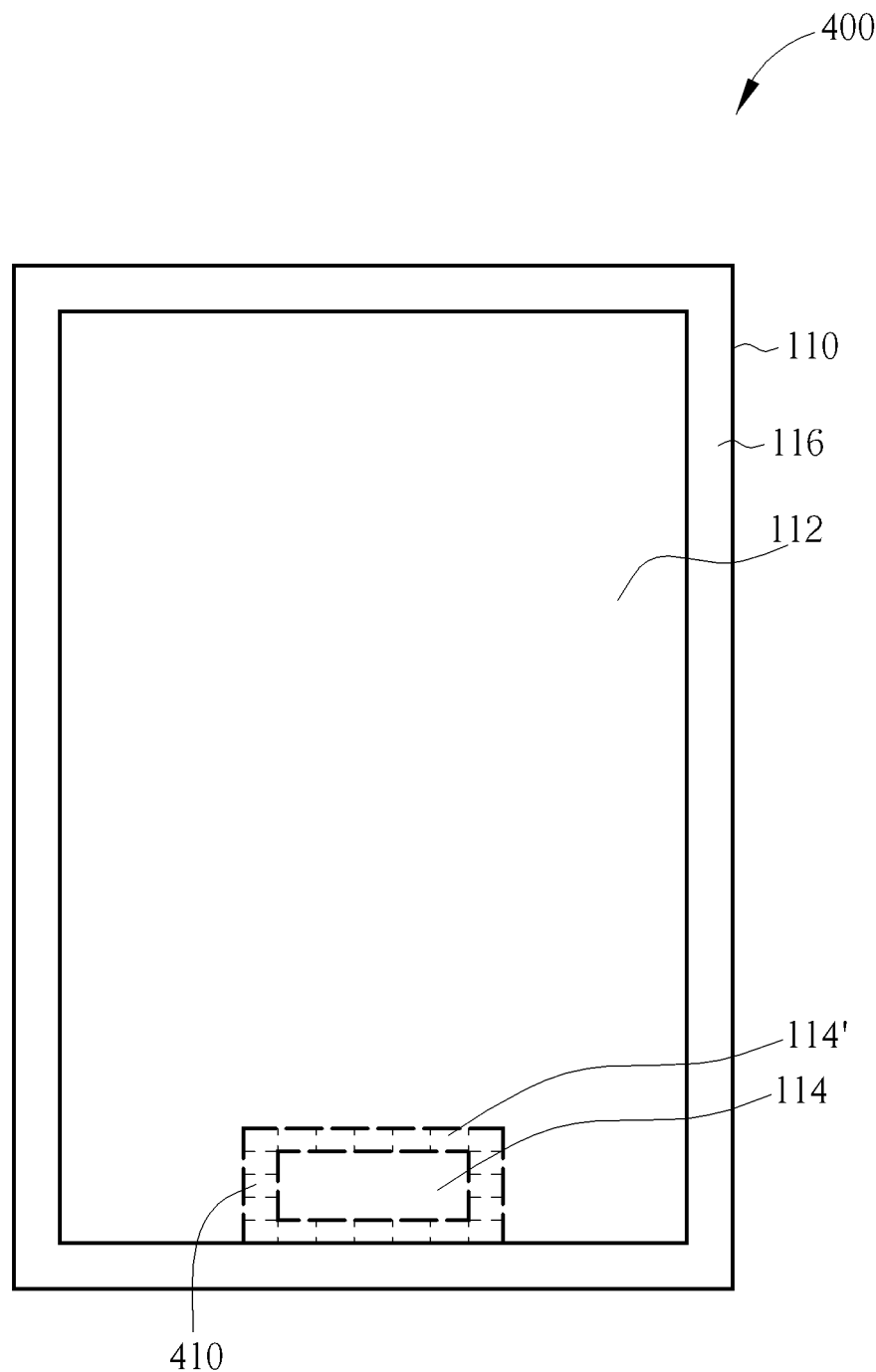
FIG. 15 is a top-view schematic diagram of according to a fourth embodiment of a display device of the present disclosure.
Figure 16:
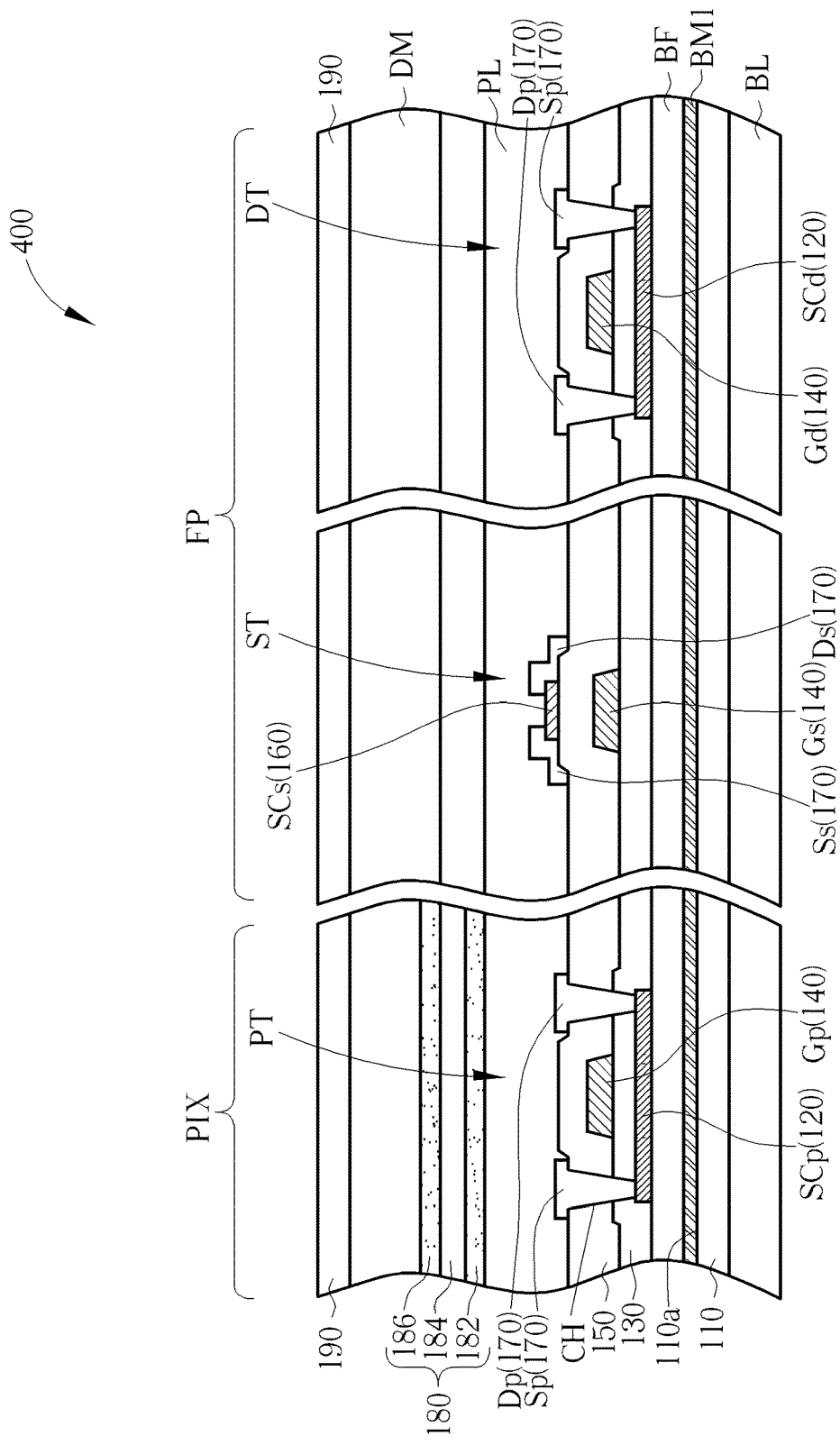
FIG. 16 is a schematic diagram of a partial cross-sectional view according to the fourth embodiment of the display device of the present disclosure.

Referring to FIG. 15 and FIG. 16, FIG. 15 is a top-view schematic diagram according to a fourth embodiment of a display device of the present disclosure, and FIG. 16 is a schematic diagram of a partial cross-sectional view according to the fourth embodiment of the display device of the present disclosure. The difference between this embodiment and the first embodiment is that the first shielding layer BM1 of the display device 400 of this embodiment totally overlaps the biometric recognition area 114, which means the first shielding layer BM1 overlaps the biometric recognition area 114 in the direction perpendicular to the first surface 110a. In other words, in this embodiment, the light emitted from the backlight module BL cannot transmit through the biometric recognition area 114, and therefore, the biometric recognition area 114 does not have display function. However, in another embodiment, the display device 400 may not include the shielding layer for shielding the biometric recognition area 114 while a backlight module BL having local dimming function is utilized for making the biometric recognition area 114 opaque.

Besides, the display device 400 of this embodiment may further include a plurality of touching components 410 disposed at a surrounding 114' of the biometric recognition area 114 for sensing the touch of the finger. For example, the touching components 410 may include touch sensing electrodes to sense the touch of the finger through the coupling between the finger and the touch sensing electrodes. In this embodiment, the surrounding 114' of the biometric recognition area 114 may be utilized as a touch key, a function key or a switch of the biometric sensing device FP, but not limited thereto. Moreover, in this embodiment, the surrounding 114' of the biometric recognition area 114 may still have the display function since it is situated in the display region 112. In this design, the surrounding 114' of the biometric recognition area 114 has the touch sensing function and the display function at the same time, and the first shielding layer BM1 does not overlap the surrounding 114' of the biometric recognition area 114.

In a variant embodiment, the biometric recognition area 114 may be situated outside the display region 112 rather than inside the display region 112. In another variant embodiment, the second substrate 190 of the display device 400 may be disposed between the first substrate 110 and the backlight module BL, similarly to the display device 300 of the third embodiment, and thus the display device 400 may further include the second shielding layer BM2 disposed on the second substrate 190, and the second shielding layer BM2 overlaps the biometric recognition area 114 in the direction perpendicular to the first surface 110a.

Figure 17:
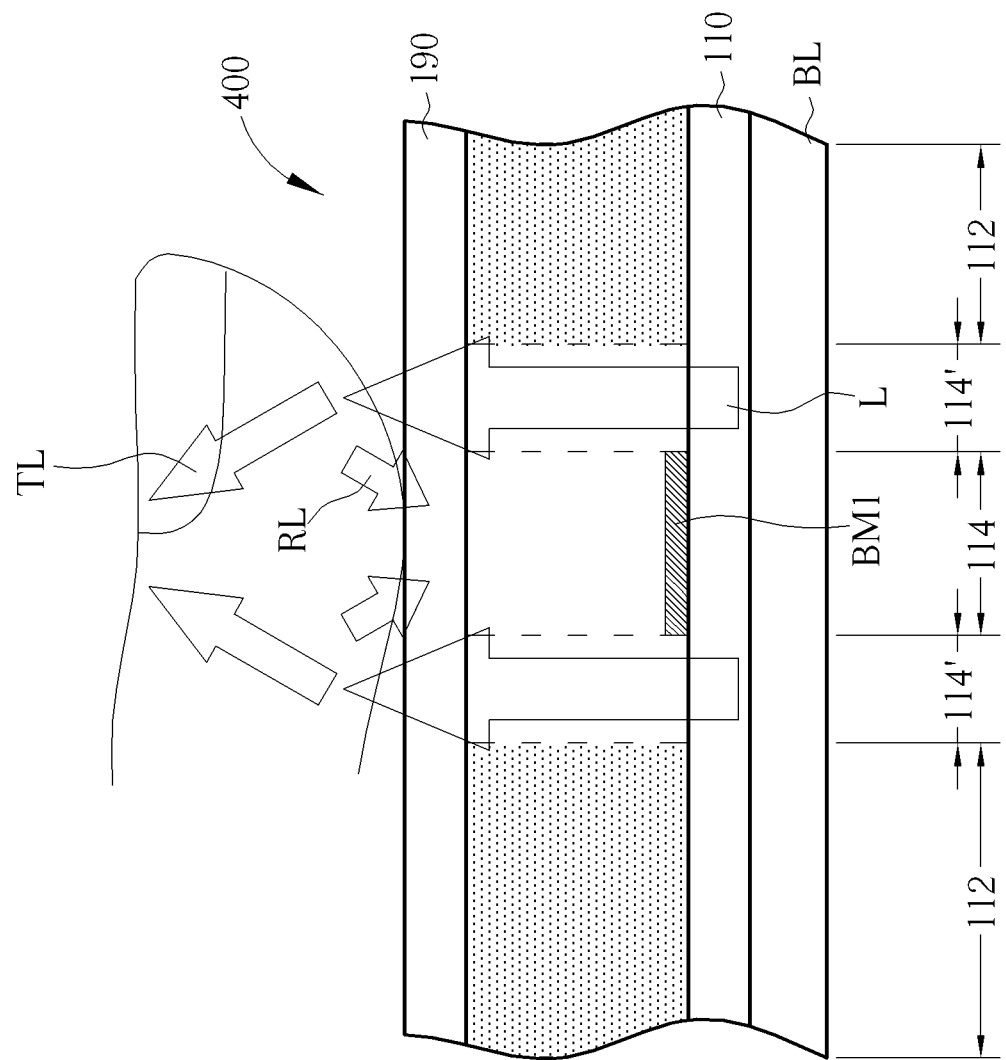
FIG. 17 is a schematic diagram of a cross-sectional view of the display device shown in FIG. 15 when performing biometric recognition.

Referring to FIG. 17, FIG. 17 is a schematic diagram of a cross-sectional view of the display device shown in FIG. 15 when performing biometric recognition, wherein the biometric sensing device FP and the touching components 410 are not shown in FIG. 17. Since the biometric recognition area 114 overlaps the first shielding layer BM1, when the display device 400 of this embodiment performs the biometric recognition, the display components 180 may be controlled to make the surrounding 114' of the biometric recognition area 114 at a light-transmissive state (such as with the highest gray level) and enable the light L emitted from the backlight module BL to illuminate the biometric, so as to form the transmitting light TL transmitting through the finger and the reflective light RL reflected from the biometric. Accordingly, the sensing units SM of the biometric sensing device FP can determine the biometric features by sensing the intensity of the reflective light RL. Since the surrounding 114' of the biometric recognition area 114 is utilized for providing lateral light or surrounding light related to the biometric recognition area 114 when the display device 400 of this embodiment performs the biometric recognition, it can reduce the interference of the sensing components ST of the biometric sensing device FP due to multiple light, so as to reduce noise. In addition, in this embodiment, the display components 180 may be controlled for making the portion of the display region 112 outside the surrounding 114' opaque, but not limited thereto. In a variant embodiment, a backlight module BL having the local dimming function may be utilized to directly control the light-emitting area of the backlight module BL, such that the light is emitted only from the surrounding 114' but not from the other area of the display device 400.

To summarize, the biometric sensing device of the present disclosure is an optical electric-charges sensing device, wherein the sensing components of the biometric sensing device would have different threshold voltages according to the intensity of the reflective light or the transmitting light correspondingly produced from the light illuminating the biometric features. Then, by controlling the outputted signals of the sensing control lines and the driving control lines, different values of electric charges would be correspondingly stored in the electricity storage components according to the deviation of the threshold voltages, and then the profile of the biometric would be determined in accordance with the electric charges stored in the electricity storage components. Therefore, this design can improve the intensity of the sensing signals (for example, the difference of the stored electric charges may reach 10 fC~40 fC), so as to increase the accuracy of biometric recognition. In another aspect, the size of the sensing components can be reduced for achieving the high resolution measurement or saving space without influencing the shift value of the threshold voltage of the sensing components. In still another aspect, the biometric sensing device of the present disclosure can be integrated in a display device through simple fabrication process, wherein the backlight module or the self-luminous type display components of the display device can provide light to illuminate the biometric such that the biometric sensing device can sense the biometric features according to the intensity of the reflective light or the transmitting light. The present disclosure can serve as a biological feature detector for recognizing various biological features. That is to say, the present disclosure can be applied to any biological feature recognitions as long as the biological features having a surface pattern or feature that can cause different reflective light intensity and transmitting light intensity.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A biometric sensing device, comprising:
    a first electricity storage component;
    a first sensing component coupled with the first electricity storage component, wherein when the first sensing component is turned on, a charging path is formed between the first sensing component and the first electricity storage component, and the first sensing component makes the first electricity storage component be charged according to a sensed biometric;
    a first driving component coupled with the first electricity storage component and the first sensing component, wherein when the first driving component is turned on, the first electricity storage component discharges; and
    a control unit coupled with at least one of the first sensing component and the first driving component for turning on the first sensing component and the first driving component.

2. The biometric sensing device according to claim 1, wherein the control unit outputs a control signal for turning on the first sensing component and turning off the first driving component in a first period in order to form the charging path, and the control unit outputs a control signal for turning on the first driving component and turning off the first sensing component in a second period in order to make the first electricity storage component discharge, wherein the first period and the second period do not overlap.

3. The biometric sensing device according to claim 1, wherein the first sensing component comprises:
    a gate coupled with the control unit;
    a source coupled with the gate; and
    a drain coupled with the first electricity storage component; and
the first driving component comprises:
    a control node coupled with the control unit;
    a first node coupled with the first electricity storage component and the drain of the first sensing component; and
    a second node, wherein the first electricity storage component discharges through the second node.

4. The biometric sensing device according to claim 3, further comprising an arithmetic unit, wherein the first node of the first driving component release the electric charges stored in the first electricity storage component to the arithmetic unit.

5. The biometric sensing device according to claim 3, further comprising a flip-flop, wherein two nodes of the flip-flop are respectively coupled with the gate of the first sensing component and the control node of the first driving component.

6. The biometric sensing device according to claim 3, wherein the control node of the first driving component is coupled with the gate of the first sensing component, and the first driving component is a transistor having a channel polarity opposite to a channel polarity of the first sensing component.

7. The biometric sensing device according to claim 3, further comprising:
a sensing control line coupled with the control unit and the gate of the first sensing component;
a driving control line coupled with the control node of the first driving component; and
a signal receiving line coupled with the second node of the first driving component.

8. The biometric sensing device according to claim 3, further comprising:
a second electricity storage component;
a second sensing component comprising:
a gate coupled with the control unit;
a source coupled with the gate of the second sensing component; and
a drain coupled with the second electricity storage component,
wherein when the second sensing component is turned on, a charging path is formed between the second sensing component and the second electricity storage component, and the second sensing component makes the second electricity storage component be charged according to the sensed biometric; and
a second driving component comprising:
a control node coupled with the control unit;
a first node coupled with the second electricity storage component and the drain of the second sensing component; and
a second node, wherein when the second driving component is turned on, the second electricity storage component discharges through the second node.

9. The biometric sensing device according to claim 8, wherein the control node of the first driving component is coupled with the gate of the second sensing component.

10. The biometric sensing device according to claim 1, wherein the first sensing component comprises:
a gate coupled with the control unit;
a source coupled with a voltage source; and
a drain coupled with the first electricity storage component; and
the first driving component comprises:
a control node coupled with the control unit;
a first node coupled with the first electricity storage component and the drain of the first sensing component; and
a second node, wherein the first electricity storage component discharges through the second node.

11. A display device, comprising:
a first substrate comprising a biometric recognition area;
a second substrate disposed opposite to the first substrate;
a plurality of pixel transistors disposed on the first substrate;
a biometric sensing device disposed on the first substrate, the biometric sensing device comprising:
a plurality of electricity storage components disposed in the biometric recognition area;
a plurality of sensing components disposed in the biometric recognition area and respectively coupled with the electricity storage components;
a plurality of driving components disposed in the biometric recognition area and respectively coupled with the electricity storage components and the sensing components; and
a control unit coupled with at least one of the sensing components and the driving components through a plurality of signal lines respectively; and
a plurality of display components respectively disposed on the pixel transistors and respectively coupled with the pixel transistors.

12. The display device according to claim 11, wherein the control unit is disposed outside the biometric recognition area.

13. The display device according to claim 11, further comprising:
a first semiconductor layer disposed on the first substrate, the first semiconductor layer comprising semiconductor channels of the pixel transistors and semiconductor channels of the driving components;
a first gate insulation layer disposed on the first semiconductor layer;
a first conductive layer disposed on the first gate insulation layer, the first conductive layer comprising gates of the pixel transistors, gates of the sensing components and gates of the driving components;
a second gate insulation layer disposed on the first conductive layer;
a second semiconductor layer disposed on the second gate insulation layer, the second semiconductor layer comprising semiconductor channels of the sensing components; and
a second conductive layer disposed on the second semiconductor layer and the second gate insulation layer, the second conductive layer comprising sources and drains of the pixel transistors, sources and drains of the sensing components, and sources and drains of the driving components.

14. The display device according to claim 11, further comprising:
a first conductive layer disposed on the first substrate, the first conductive layer comprising gates of the pixel transistors, gates of the sensing components and gates of the driving components;
a gate insulation layer disposed on the first conductive layer;
a semiconductor layer disposed on the gate insulation layer, the semiconductor layer comprising semiconductor channels of the pixel transistors, semiconductor channels of the sensing components and semiconductor channels of the driving components; and
a second conductive layer disposed on the semiconductor layer and the gate insulation layer, the second conductive layer comprising sources and drains of the pixel transistors, sources and drains of the sensing components, and sources and drains of the driving components.

15. The display device according to claim 11, further comprising a shielding layer disposed between the first substrate and the second substrate, wherein the first substrate has a first surface, and the shielding layer at least partially overlaps the pixel transistors and the driving components in a direction perpendicular to the first surface.

16. The display device according to claim 11, further comprising a shielding layer disposed between the first substrate and the second substrate, wherein the first substrate has a first surface, and the shielding layer overlaps the biometric recognition area in a direction perpendicular to the first surface.

17. The display device according to claim 11, further comprising:

a semiconductor layer disposed on a first surface of the first substrate, the first semiconductor layer comprising semiconductor channels of the pixel transistors, semiconductor channels of the sensing components and semiconductor channels of the driving components;

a gate insulation layer disposed on the semiconductor layer;

a first conductive layer disposed on the gate insulation layer, the first conductive layer comprising gates of the pixel transistors, gates of the sensing components and gates of the driving components;

an insulation layer disposed on the first conductive layer;

a second conductive layer disposed on the insulation layer, the second conductive layer comprising sources and drains of the pixel transistors, sources and drains of the sensing components, and sources and drains of the driving components;

a shielding layer disposed between the first substrate and the second substrate, wherein the shielding layer at least partially overlaps the pixel transistors and the driving components in a direction perpendicular to the first surface; and a backlight module, wherein the second substrate is disposed between the first substrate and the backlight module.

18. The display device according to claim 11, further comprising a plurality of touching components disposed at a periphery of the biometric recognition area.

19. The display device according to claim 11, further comprising a backlight module, wherein the first substrate is disposed between the second substrate and the backlight module.

20. The display device according to claim 11, wherein each of the display components comprises at least one organic light emitting diode or at least one inorganic light emitting diode.

* * * * *